United States Patent
Wang et al.

(10) Patent No.: US 12,402,384 B2
(45) Date of Patent: Aug. 26, 2025

(54) STANDARD CELL DESIGN WITH DUMMY PADDING

(71) Applicant: Taiwan Semiconductor Manufacturing Company, Ltd., Hsinchu (TW)

(72) Inventors: Sheng-Hsiung Wang, Zhubei (TW); Chun-Yen Lin, Hsinchu (TW); Yen-Hung Lin, Hsinchu (TW); Yuan-Te Hou, Hsinchu (TW); Tung-Heng Hsieh, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 579 days.

(21) Appl. No.: 17/749,842

(22) Filed: May 20, 2022

(65) Prior Publication Data
US 2023/0253477 A1    Aug. 10, 2023

Related U.S. Application Data

(60) Provisional application No. 63/308,831, filed on Feb. 10, 2022.

(51) Int. Cl.
*H10D 64/01* (2025.01)
*B82Y 10/00* (2011.01)
(Continued)

(52) U.S. Cl.
CPC ......... *H10D 64/017* (2025.01); *H10D 62/115* (2025.01); *H10D 84/856* (2025.01)

(58) Field of Classification Search
CPC ........... H01L 29/66545; H01L 27/0922; H01L 29/0649; H01L 21/823412;
(Continued)

(56) References Cited

U.S. PATENT DOCUMENTS

| | | |
|---|---|---|
| 6,838,713 B1 | 1/2005 | Gheewala et al. |
| 8,759,885 B1 | 6/2014 | Jain et al. |

(Continued)

FOREIGN PATENT DOCUMENTS

| | | |
|---|---|---|
| JP | 2009130167 A | 6/2009 |
| KR | 2005-0063674 | 6/2005 |

(Continued)

OTHER PUBLICATIONS

Wen et al., "Isolation Structure and a Self-Aligned Capping Layer Formed Thereon," U.S. Appl. No. 17/748,632, filed May 19, 2022, Assignee: Taiwan Semiconductor Manufacturing Company, Ltd., 28 pages specification, 21 pages drawings.

*Primary Examiner* — Herve-Louis Y Assouman
(74) *Attorney, Agent, or Firm* — HAYNES AND BOONE, LLP

(57) ABSTRACT

A semiconductor structure includes a substrate; a first column of active regions over the substrate; a second column of active regions over the substrate; and a dummy padding disposed between the first and the second columns from a top view. The dummy padding includes multiple dummy regions. A first dummy region of the multiple dummy regions is disposed between a first active region in the first column of active regions and a second active region in the second column of active regions. An outer boundary line tracing an edge of the first active region, an edge of the first dummy region, and an edge of the second active region includes at least two substantially 90-degree bends from a top view. The first and the second active regions include a semiconductor material doped with a same dopant.

20 Claims, 21 Drawing Sheets

(51) Int. Cl.
  *H10D 30/01* (2025.01)
  *H10D 30/43* (2025.01)
  *H10D 30/62* (2025.01)
  *H10D 30/67* (2025.01)
  *H10D 30/69* (2025.01)
  *H10D 62/10* (2025.01)
  *H10D 62/822* (2025.01)
  *H10D 84/01* (2025.01)
  *H10D 84/03* (2025.01)
  *H10D 84/83* (2025.01)
  *H10D 84/85* (2025.01)
  *H10D 89/10* (2025.01)

(58) Field of Classification Search
  CPC ......... H01L 21/823481; H01L 27/0207; H01L 27/088; H01L 29/0673; H01L 27/0886; H01L 21/823431; H01L 29/165; H01L 29/42392; H01L 29/66439; H01L 29/775; H01L 29/7848; H01L 27/092; H01L 29/0638; H01L 27/0924; H01L 29/785; B82Y 10/00
  See application file for complete search history.

(56) References Cited

U.S. PATENT DOCUMENTS

| | | | |
|---|---|---|---|
| 10,423,078 | B1 | 9/2019 | Shen et al. |
| 2005/0254280 | A1 | 11/2005 | Yamauchi |
| 2011/0049575 | A1 | 3/2011 | Tanaka |
| 2018/0240890 | A1 | 8/2018 | Yang et al. |
| 2020/0035705 | A1* | 1/2020 | Kim ................ H01L 21/823481 |
| 2020/0050728 | A1 | 2/2020 | Kim et al. |
| 2020/0105761 | A1* | 4/2020 | Liaw ................ H01L 21/823821 |
| 2020/0176303 | A1 | 6/2020 | Yang et al. |
| 2021/0265481 | A1 | 8/2021 | Huang et al. |
| 2021/0336004 | A1 | 10/2021 | Huang et al. |
| 2021/0391421 | A1 | 12/2021 | Chu et al. |

FOREIGN PATENT DOCUMENTS

| | | |
|---|---|---|
| KR | 2020-0089052 | 7/2005 |
| KR | 20150034506 A | 4/2015 |
| TW | 201916367 A | 4/2019 |
| TW | 202141638 A | 11/2021 |

* cited by examiner

STANDARD CELL DESIGN WITH DUMMY PADDING

PRIORITY

This claims the benefits of U.S. Prov. App. Ser. No. 63/308,831, filed Feb. 10, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when implementing ICs using standard cells, it is desirable to reduce leakage current between active regions, between an active region and adjacent wells, and between an active region and adjacent source/drain contacts.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only except explicitly disclosed. In fact, the dimensions of the various features may be arbitrarily increased or reduced for clarity of discussion.

FIGS. 1A-1 and 1A-2 illustrate another semiconductor structure for comparison with embodiments of the present disclosure.

FIGS. 1B-1, 1B-2, and 1B-3 illustrate fragmentary cross-sectional views of the semiconductor structure in FIG. 1A taken along line B-B as shown in FIG. 1A, according to embodiments of the present disclosure.

FIGS. 1C-1 and 1C-2 illustrate fragmentary cross-sectional views of the semiconductor structure in FIG. 1A taken along line C-C as shown in FIG. 1A, according to embodiments of the present disclosure.

FIGS. 2, 3, 4, 5, 6A, 7, 8, 9, 10, 11, 12, 13, and 14 illustrate fragmentary top views of the semiconductor structure of FIG. 1A, according to alternative embodiments of the present disclosure.

FIGS. 6B-1 and 6B-2 illustrate fragmentary cross-sectional views of the semiconductor structure in FIG. 6A taken along line B-B as shown in FIG. 6A, according to embodiments of the present disclosure.

DETAILED DESCRIPTION

Figure 1A:
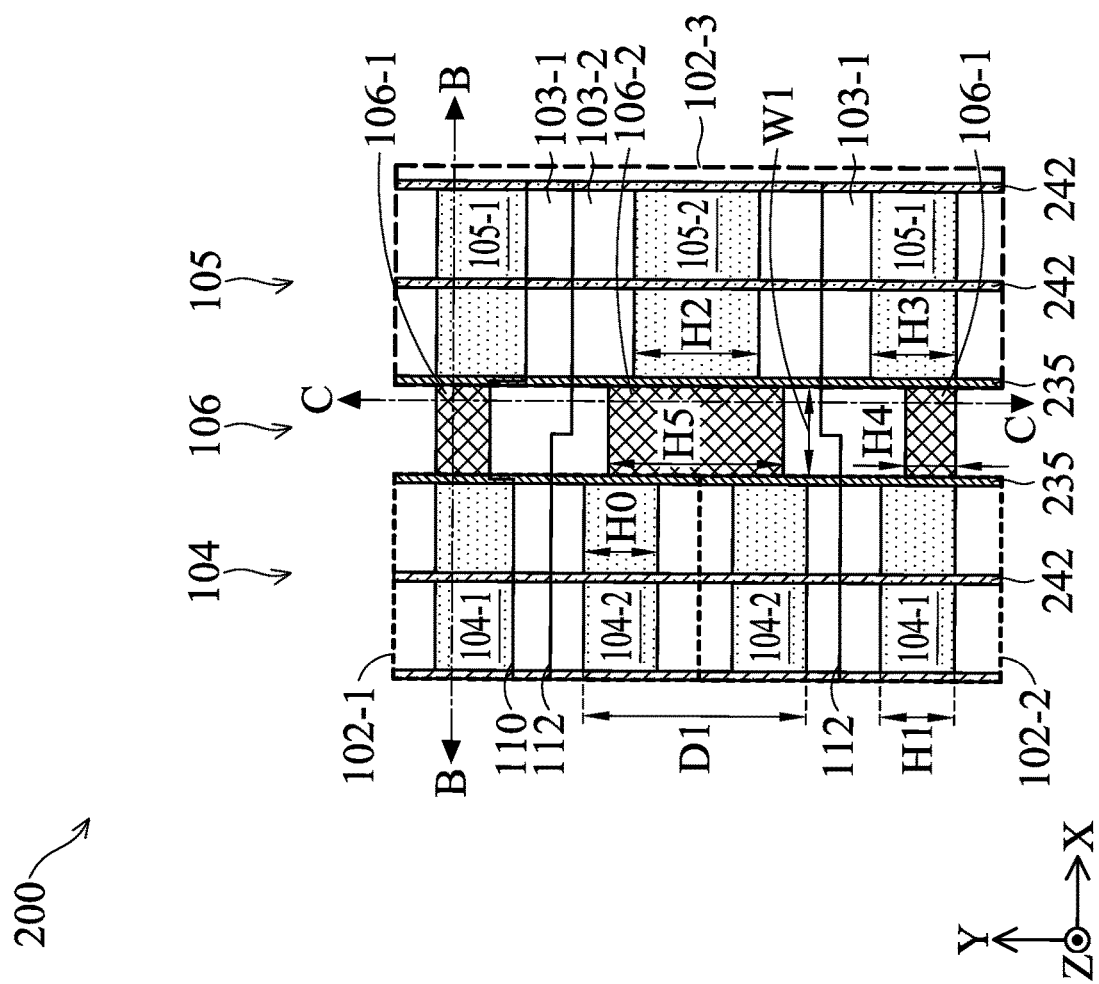
FIG. 1A illustrates a fragmentary top view of a semiconductor structure, such as an integrated circuit having standard cells, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

The present disclosure relates to semiconductor structures and methods thereof, and more particularly to providing dummy paddings between adjacent active regions of standard cells (e.g., standard CMOS cells) in a semiconductor structure such as an integrated circuit (IC). The standard cells may include NPN cells, PNP cells, NPPN cells, PNNP cells, and/or other types of cells. Here, "N" refers to an n-type doped active region, and "P" refers to a p-type doped active region. For example, an NPN cell refers to a cell having an n-type doped active region adjacent to a p-type doped active region that is adjacent to another n-type doped active region. The dummy paddings help increase design margin and reduce leakage current among active regions, between active regions and nearby source/drain contacts, and between active regions and nearby wells. Using the disclosed dummy paddings can increase the maximum operating frequency of the standard cells, thereby increasing the operational speed of the semiconductor structure incorporating such standard cells.

FIG. 1A illustrates a fragmentary top view of a semiconductor structure 200, such as an integrated circuit having standard cells, according to various aspects of the present disclosure. Referring to FIG. 1A, the semiconductor structure 200 includes various active regions 104 (including active regions 104-1 and 104-2) arranged into a column along the Y direction and various active regions 105 (including active regions 105-1 and 105-2) arranged into a column along the Y direction. The active regions 104 and 105 are oriented lengthwise along the X direction and widthwise along the Y direction. The active regions 104-1 and 105-1 are doped with the same type of dopant(s). The active regions 104-2 and 105-2 are doped with the same type of dopant(s). Essentially, the active regions 104-1 and 105-1 may be same (though they may have different widths), and the active regions 104-2 and 105-2 may be same (though they may have different widths). They are labeled differently for the simplicity of referencing. The dopants in the active regions 104-1 and 105-1 and the dopants in the active regions 104-2 and 105-2 are of opposite conductivity types. For example, the dopants in the active regions 104-1 and 105-1 are of n-type conductivity and the dopants in the active regions 104-2 and 105-2 are of p-type conductivity, or vice versa. For example, the active regions 104-1, 104-2, 105-1, and 105-2 may include silicon, silicon germanium, or other semiconductor material(s) doped with appropriate dopants, such as phosphorus or arsenic for n-type conductivity or boron for p-type conductivity.

In the present embodiment, the active regions 104 and 105 are formed over wells 103. For example, the active regions 104-1 and 105-1 are formed over wells 103-1 and the active regions 104-2 and 105-2 are formed over wells 103-2. In an embodiment, the wells 103-1 and the active regions 104-1 and 105-1 are doped with dopants of opposite conductivity types, and the wells 103-2 and the active regions 104-2 and 105-2 are doped with dopants of opposite conductivity types. FIG. 1A also illustrates boundary lines 112 between each well 103-2 and adjacent wells 103-1.

The active regions 104 are isolated from each other along the Y direction by an isolation structure 107 (see FIGS. 1C-1, 1C-2), such as shallow trench isolation (STI). Similarly, the active regions 105 are isolated from each other along the Y direction by the isolation structure 107 (see FIGS. 1C-1, 1C-2).

In the illustrated embodiment, the top two active regions 104-1 and 104-2 form a standard CMOS cell 102-1, the bottom two active regions 104-1 and 104-2 form another standard CMOS cell 102-2, and the two active regions 105-1 and the active region 105-2 form a standard CMOS cell 102-3. In an embodiment, the two cells 102-1 and 102-2 are both NP cells and the cell 102-3 is an NPN cell (i.e., the active regions 104-1 and 105-1 are n-type doped and the active regions 104-2 and 105-2 are p-type doped). In an alternative embodiment, the two cells 102-1 and 102-2 are both PN cells and the cell 102-3 is a PNP cell (i.e., the active regions 104-1 and 105-1 are p-type doped and the active regions 104-2 and 105-2 are n-type doped).

The active region 105-1 is wider than the active region 104-1 along the Y direction. The active region 105-2 is wider than each active region 104-2 along the Y direction. By having active regions 105-1 and 105-2 wider than the active region 104-1 and 104-2, the cell 102-3 is provided with more current capability than each cell 102-1 and 102-2. The well 103-1 is wider in the column having active regions 105 than in the column having active regions 104. The well 103-2 is narrower in the column having active regions 105 than in the column having active regions 104. As illustrated in FIG. 1A, a boundary line 112 between a well 103-1 and a well 103-2 has two 90-degree (or near 90-degree) bends (or angles or jogs) at where the widths of the wells 103-1 and 103-2 change.

Still referring to FIG. 1A, the semiconductor structure 200 includes various dummy regions 106 (including dummy regions 106-1 and 106-2) in a column (also referred to as a dummy padding 106) that is disposed between the column of active regions 104 and the column of active regions 105. Specifically, a dummy region 106-1 is disposed laterally (along the X direction) between the top active region 104-1 and the top active region 105-1, another dummy region 106-1 is disposed laterally between the bottom active region 104-1 and the bottom active region 105-1. Further, a dummy region 106-2 is disposed laterally between the active regions 104-2 and the active region 105-2.

In an embodiment, dummy regions 106-1 include the same semiconductor material(s) as in the active regions 104-1 and 105-1 and are doped with the same dopant(s) as in the active regions 104-1 and 105-1. Also, dummy regions 106-2 include the same semiconductor material(s) as in the active regions 104-2 and 105-2 and are doped with the same dopant(s) as in the active regions 104-2 and 105-2. What makes the regions 106 "dummy" is that there are no functional transistors formed in these regions. For example, there may be no functional gates formed over dummy regions 106, or that there may be no contacts formed over dummy regions 106 such that dummy regions 106 are not electrically connected to other parts of the semiconductor structure 200. In contrast, there are functional transistors formed in the active regions 104 and 105. In another embodiment, dummy regions 106 include one or more dielectric materials. Thus, they are not conductive or semiconductive.

In various embodiments, FIGS. 1A, 2-5, 6A, and 7-14 illustrate layout views (or layouts) of the semiconductor structure 200. In such embodiments, the dummy regions 106 may be implemented in a different CAD (Computer Aided Design) layer than the active regions 104 and 105 such that CAD tools may process the dummy regions 106 differently than the active regions 104 and 105. For example, CAD tools may perform OPC (Optical Proximity Correction) to the active regions 104 and 105 so that the shapes of the active regions 104 and 105 can be manufactured as close to their original design as possible (such as rectangular or substantially rectangular), even if such OPC would change or distort the shapes of the dummy regions 106. This provides benefits that there are increased design margin and reduced leakage between adjacent active regions 104 and 105 and between active regions 104 and 105 and nearby source/drain contacts, as will be discussed below with reference to FIG. 1A-2.

Still referring to FIG. 1A, the semiconductor structure 200 further includes isolation structures 235 that are oriented lengthwise along the Y direction and disposed between the dummy regions 106 and the active regions 104 and 105. In an embodiment, the isolation structures 235 may be dielectric gates or CPODE (Continuous Poly On Diffusion Edge). The isolation structures 235 include one or more dielectric materials such as silicon oxide and silicon nitride.

The benefits of having the dummy regions 106 are explained below by comparing the semiconductor structure 200 with a semiconductor structure 200' illustrated in FIGS. 1A-1 and 1A-2. The semiconductor structure 200' is similar to the semiconductor structure 200, but without the dummy regions 106. The semiconductor structure 200' shown in FIGS. 1A-1 and 1A-2 is not prior art and is merely used to explain the benefits of having the dummy regions 106 in the semiconductor structure 200.

Figures 1, 1A:
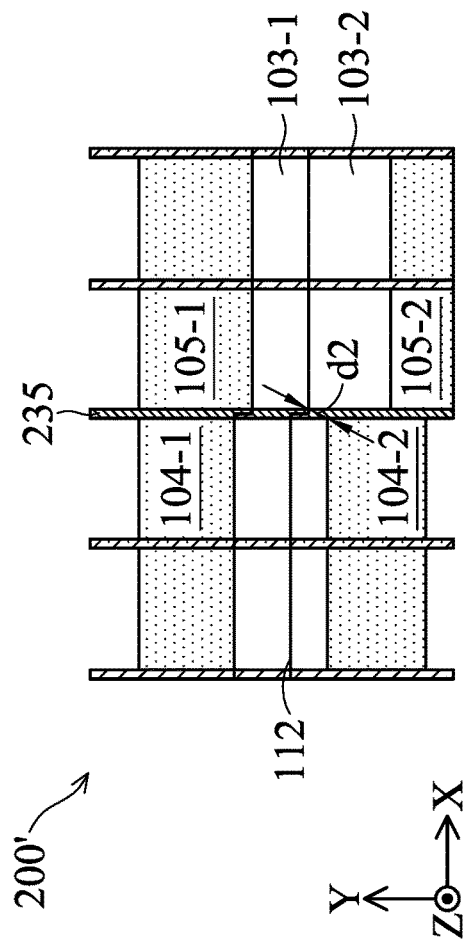

Referring to FIG. 1A-1, the bends in the boundary line 112 coincide with the isolation structure 235. The smallest distance between the active region 104-2 and the well 103-1 is the distance d2 from a corner of the active region 104-2 to a corner of the well 103-1, illustrated by a double arrow in FIG. 1A-1. The distance d2 may or may not meet the manufacturer's design rules. In contrast, by having the dummy regions 106, the bends in the boundary line 112 are disposed into the space between the isolation structures 235 as shown in FIG. 1A. As a result, any distance from an edge of the active region 104-2 and an edge of the well 103-1 in FIG. 1A is greater than d2, which beneficially reduces potential leakage between the active region 104-2 and the well 103-1.

Figures 1, 1A, 2:
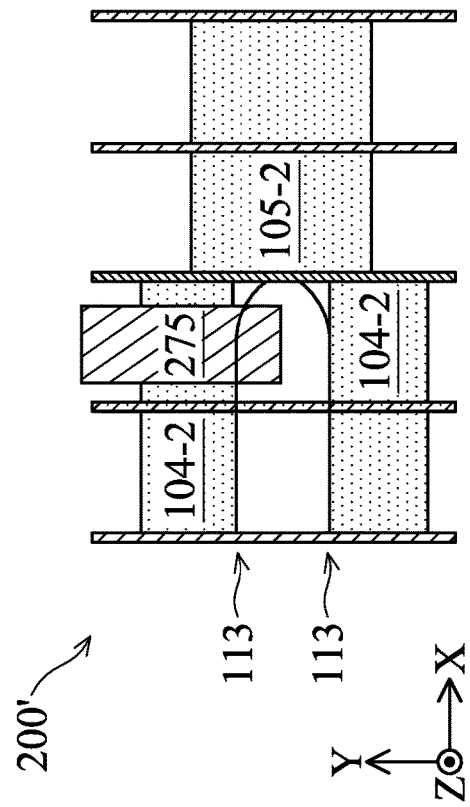

Referring to FIG. 1A-2, a source/drain contact 275 is disposed on the active region 104-2. Although not shown, source/drain contacts are also disposed on various active regions 104 and 105 in the embodiment in FIG. 1A. The source/drain contact 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof. The metal fill layer may include tungsten (W), cobalt (Co), molybdenum (Mo), ruthenium (Ru), or other metals.

As shown in FIG. 1A-2, the source/drain contact 275 is disposed on the active region 104-2 and extends beyond the active region 104-2 along the Y direction from a top view. FIG. 1A-2 also illustrates peripheries 113 of the active regions 104-2 after fabrication. The peripheries 113 extend substantially straight except in the vicinity where the active regions 104-2 meet the active region 105-2. In this vicinity, the peripheries 113 become curved due to optical proximity effects and/or other manufacturing effects (such as etching). As a result, the two active regions 104-2 become closer to each other after fabrication than they are originally designed (for example, in the design layout), which might increase leakage between the two active regions 104-2. Further, the bottom active region 104-2 becomes closer to the source/drain contact 275 than it is originally designed, which might increase leakage between the active region 104-2 and the source/drain contact 275.

In contrast, in the semiconductor structure 200 shown in FIG. 1A, the shapes of the active regions 104 and 105 can be manufactured as close to their original shape as possible (e.g., rectangular or substantially rectangular), for example, by curving the edge of the dummy region 106-2 inwards during design or during OPC. Since the dummy region 106-2 does not provide any functional transistors, such change to the dummy region 106-2 does not have any adverse effects, while providing design margin for the active regions 104 and 105. Advantageously, the semiconductor structure 200 shown in FIG. 1A can have reduced leakage between the active regions 104, 105, and between an active region 104 or 105 and adjacent source/drain contacts than the semiconductor structure 200' shown in FIG. 1A-2.

Referring to FIG. 1A, in the present embodiment, a height (or width) H1 of the active region 104-1 is greater than a height (or width) H4 of the dummy region 106-1 and is smaller than a height (or width) H3 of the active region 105-1 (i.e., H4<H1<H3). An outer boundary line 110 tracing an edge of the active region 104-1, an edge of the dummy region 106-1, and an edge of the active region 105-1 has four 90-degree or substantially 90-degree bends from a top view. Further, a height (or width) H2 of the active region 105-2 is less than a height (or width) H5 of the dummy region 106-2 that is less than a distance D1 from the top edge of the top active region 104-2 to the bottom edge of the bottom active region 104-2 (i.e., H2<H5<D1). Also, a height (or width) H0 of the active region 104-2 is less than the height H2. In an embodiment, the height H0 is equal to or substantially equal to the height H1. Further, H3 is less than H2, and half of H3 is less than H4. The design of these dimensions helps increase the design margin associated with the active regions (104-1, 104-2, 105-1, 105-2) and the wells (103-1, 103-2) as well as between the active regions and nearby source/drain contacts (not illustrated in FIG. 1A, but see FIG. 1A-2).

Figures 1, 1B:
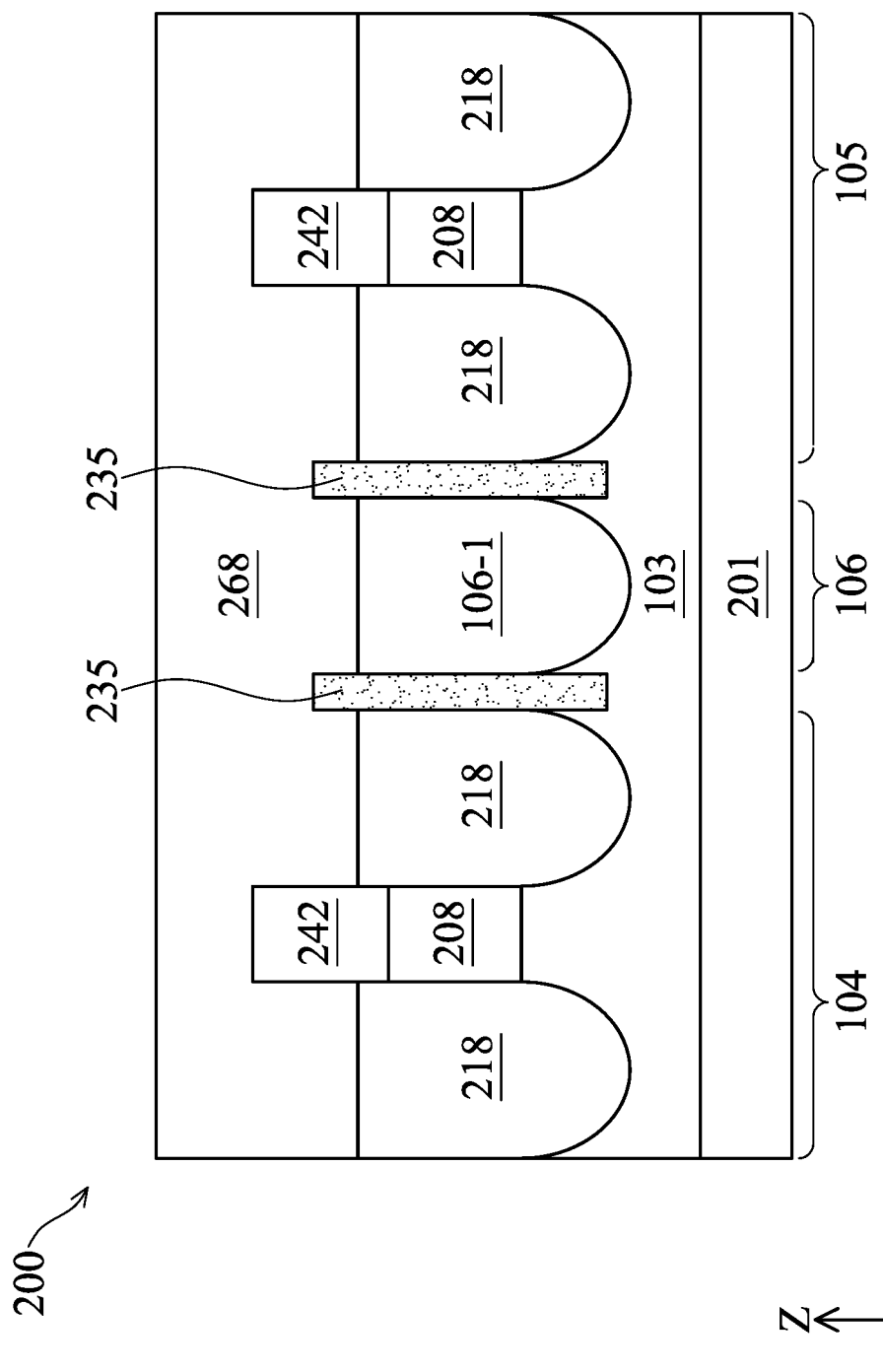
Figures 1, 1B, 2:
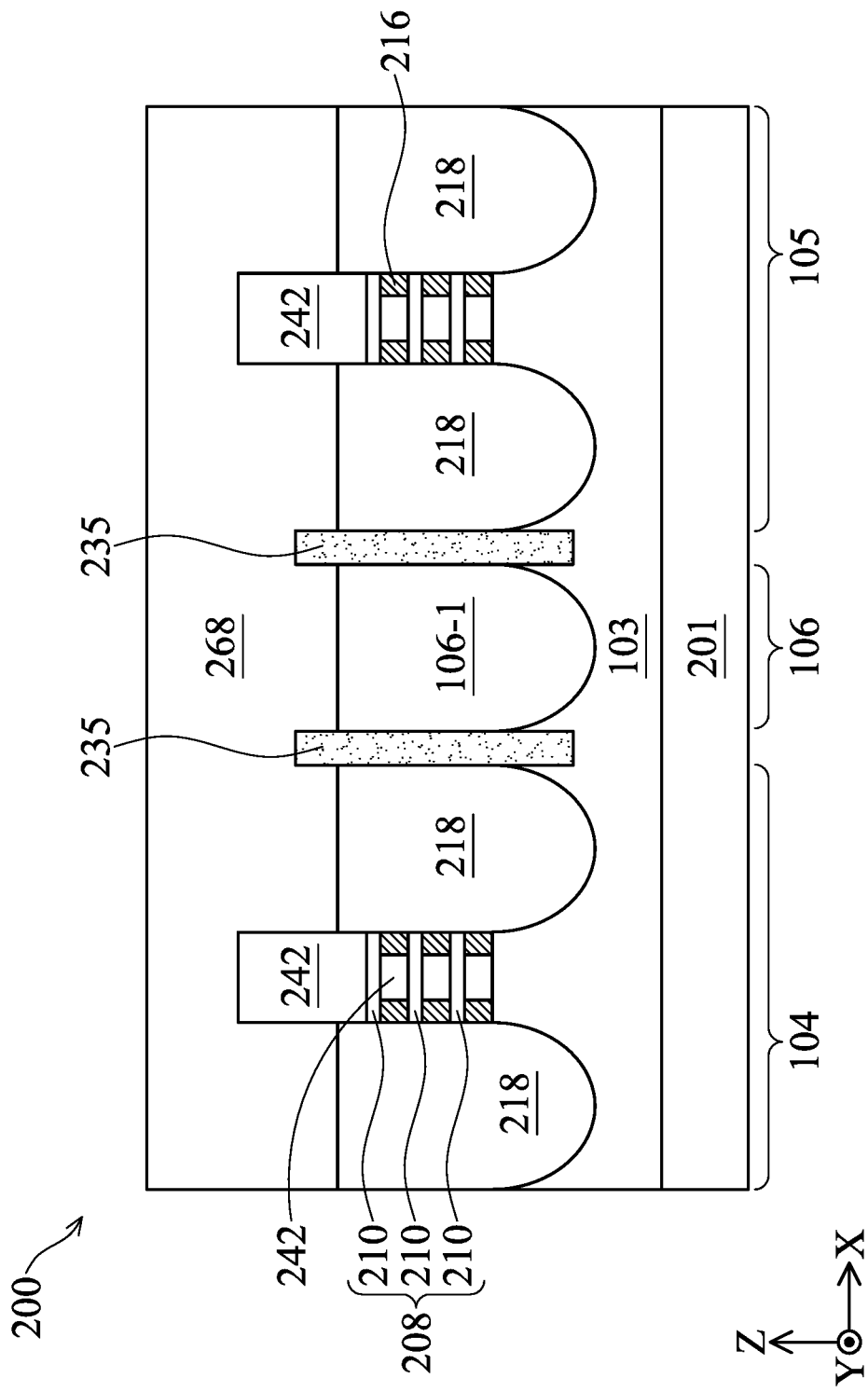

FIGS. 1B-1 and 1B-2 illustrate fragmentary cross-sectional views of the semiconductor structure 200 taken along line B-B shown in FIG. 1A, according to embodiments of the present disclosure where the dummy regions 106 include doped or undoped semiconductor material(s). In the embodiment shown in FIG. 1B-1, each of the active regions 104 and 105 includes two source/drain regions 218 and a semiconductor channel region 208 connecting the two source/drain regions 218. The semiconductor channel region 208 may be in the shape of a semiconductor fin (e.g., for FinFETs). In the embodiment shown in FIG. 1B-2, each of the active regions 104 and 105 includes two source/drain regions 218 and a semiconductor channel region 208 connecting the two source/drain regions 218. The semiconductor channel region 208 includes a stack of nano-sized channels 210 (e.g., for gate-all-around FETs). In each of the FIGS. 1B-1 and 1B-2, the dummy regions 106 may be formed in the same processes as for the source/drain regions 218. For example, the dummy regions 106 may be formed by etching into semiconductor fins to form trenches and epitaxially growing semiconductor materials in the trenches. Further, the dummy regions 106 may be doped in the same way as for the source/drain regions 218.

The semiconductor structure 200 includes a substrate 201, the wells 103, source/drain regions 218, the dummy regions 106, channel regions 208, gate structures 242, dielectric layers 268, and other elements (such as source/drain contacts 275 and other structures) not shown in FIGS. 1B-1 and 1B-2. The various elements of the semiconductor structure 200 are further discussed below.

In an embodiment, the substrate 201 is a bulk silicon substrate (i.e., including bulk single-crystalline silicon). The substrate 201 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. The wells 103 (such as the wells 103-1 and 103-2) are formed in and/or on the substrate 201 by doping portions of the substrate 201 with appropriate dopants.

The source/drain regions 218 include epitaxially grown semiconductor material(s) with proper n-type or p-type dopants. For example, each of the source/drain regions 218 may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). Alternatively, each of the source/drain regions 218 may include silicon germanium or germanium and may be doped with boron, other p-type dopant, or combinations thereof (for example, forming Si:Ge:B epitaxial source/drain features). The source/drain regions 218 may be formed by etching trenches on both sides of the respective channel region 208, and epitaxially growing semiconductor material(s) in the trenches. In an embodiment, the semiconductor channel regions 208 may include silicon and may be portions of a semiconductor fin.

Alternatively, the semiconductor channel regions 208 may include other suitable semiconductor material(s).

As discussed above, the dummy regions 106 may be formed using the same processes as for the source/drain regions 218. Thus, the dummy regions 106 may include silicon and may be doped with carbon, phosphorous, arsenic, other n-type dopant, or combinations thereof. Alternatively, the dummy regions 106 may include silicon germanium or germanium and may be doped with boron, other p-type dopant, or combinations thereof. Further, the top surface of the dummy regions 106 may be above, below, or substantially coplanar with the top surface of the semiconductor channel regions 208, depending on the epitaxial growth process that forms the dummy regions 106. The bottom surface of the dummy regions 106 may be curved or flat depending on the etching process(es) that etches trenches into a semiconductor fin and the substrate 201.

The isolation structures 235 may be formed by removing dummy gates formed at the boundary of the active regions 104, 105 and the dummy regions 106 to form isolation trenches, optionally extending the isolation trenches into the substrate 201, and filling the isolation trenches with one or more dielectric materials. The one or more dielectric materials may include silicon oxide, silicon nitride, silicon oxynitride, fluoride-doped silicate glass (FSG), a low-k dielectric material, and/or other suitable insulating material. In an embodiment, the isolation structures 235 are formed after the source/drain regions 218 have been formed. Further, the isolation structures 235 may be formed before, during, or after a replacement gate process that forms gate structures 242. In the embodiments shown in FIGS. 1B-1 and 1B-2, the isolation structures 235 extends above the top surface of the dummy regions 106.

The gate structures 242 engage the respective channel regions 208 and may include one or more gate dielectric layers, one or more work function metal layers, a bulk metal layer, and gate spacers. For simplicity, these elements are not individually illustrated. The one or more gate dielectric layers may include a dielectric material, such as $SiO_2$, HfSiO, SiON, a high-k dielectric material such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The one or more work function metal layers may include a p-type work function material and/or an n-type work function material. A p-type work function material may include TiN, TaN, TaSN, Ru, Mo, Al, WN, WCN $ZrSi_2$, $MoSi_2$, $TaSi_2$, $NiSi_2$, other p-type work function material, or combinations thereof. An n-type work function material may include Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. The bulk metal layer includes a suitable conductive material, such as Co, Al, W, and/or Cu. The bulk metal layer may additionally or collectively include other metals, metal oxides, metal nitrides, other suitable materials, or combinations thereof. The gate spacers may include a suitable dielectric material such as silicon oxide and silicon nitride.

The dielectric layers 268 may include one or more contact etch stop layers (CESL) and one or more interlayer dielectric (ILD) layers. The CESL may include silicon and nitrogen, such as silicon nitride or silicon oxynitride. The ILD layer(s) may include a dielectric material such as silicon oxide, silicon nitride, silicon oxynitride, TEOS formed oxide, phosphosilicate glass (PSG), low-k dielectric material, other suitable dielectric material, or combinations thereof.

FIG. 1B-2 illustrate the semiconductor structure 200 in another embodiment. The embodiment shown in FIG. 1B-2 is similar to the embodiment shown in FIG. 1B-1 except the differences in the channel region. In the embodiment shown in FIG. 1B-2, the channel region 208 includes a stack of nano-sized channels 210. Each channel 210 is wrapped around by the gate structure 242, thereby forming gate-all-around FETs. The semiconductor structure 200 further includes dielectric spacers 216 between the gate structure 242 and the source/drain regions 218. The dielectric spacers 216 may include a suitable dielectric material such as silicon oxide and silicon nitride.

FIG. 1B-3 illustrates a fragmentary cross-sectional view of the semiconductor structure 200 taken along line B-B shown in FIG. 1A, according to an embodiment of the present disclosure where the dummy regions 106 include one or more dielectric materials. In this embodiment, the dummy regions 106 are formed as an isolation structure, such as shallow trench isolation (STI). For example, the dummy regions 106 may be formed by etching trenches into semiconductor fins and the substrate 201, filling the trenches with one or more dielectric materials such as silicon oxide, silicon nitride, silicon oxynitride, fluoride-doped silicate glass (FSG), a low-k dielectric material, and/or other suitable insulating material. The top surface of the dummy regions 106 may be substantially co-planar with the top surface of the channel regions 208 in an embodiment or may be formed lower than the top surface of the channel regions 208 in an alternative embodiment. The bottom surface of the dummy regions 106 may be curved or flat depending on the etching process(es) that forms the isolation trenches. The embodiment in FIG. 1B-3 has the channel regions 208 in the form of semiconductor fins. Alternatively, the channel regions 208 may include a stack of nano-sized channels 210, such as shown in FIG. 1B-2.

Figures 1, 1B, 2, 3:
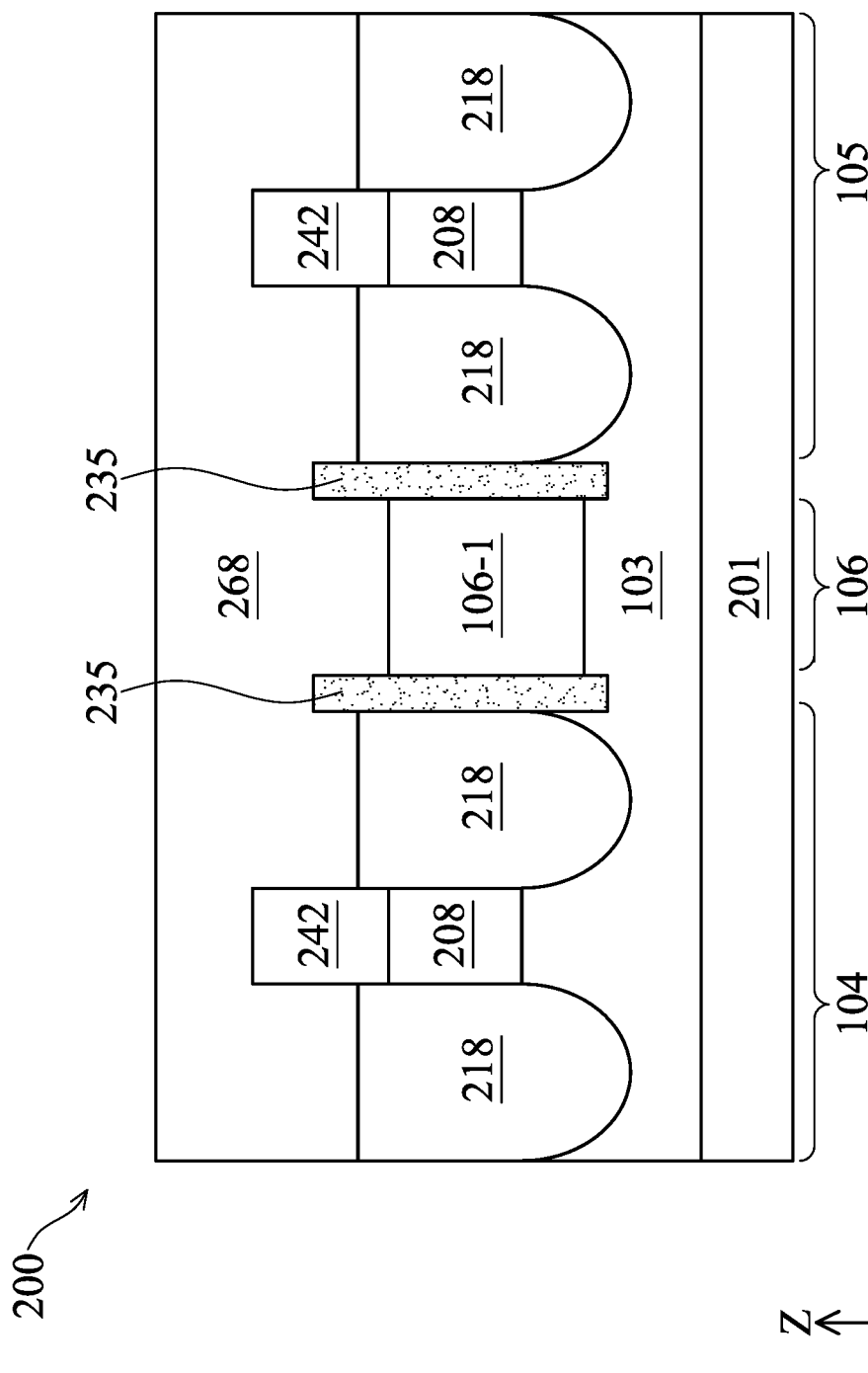
Figures 1, 1C:
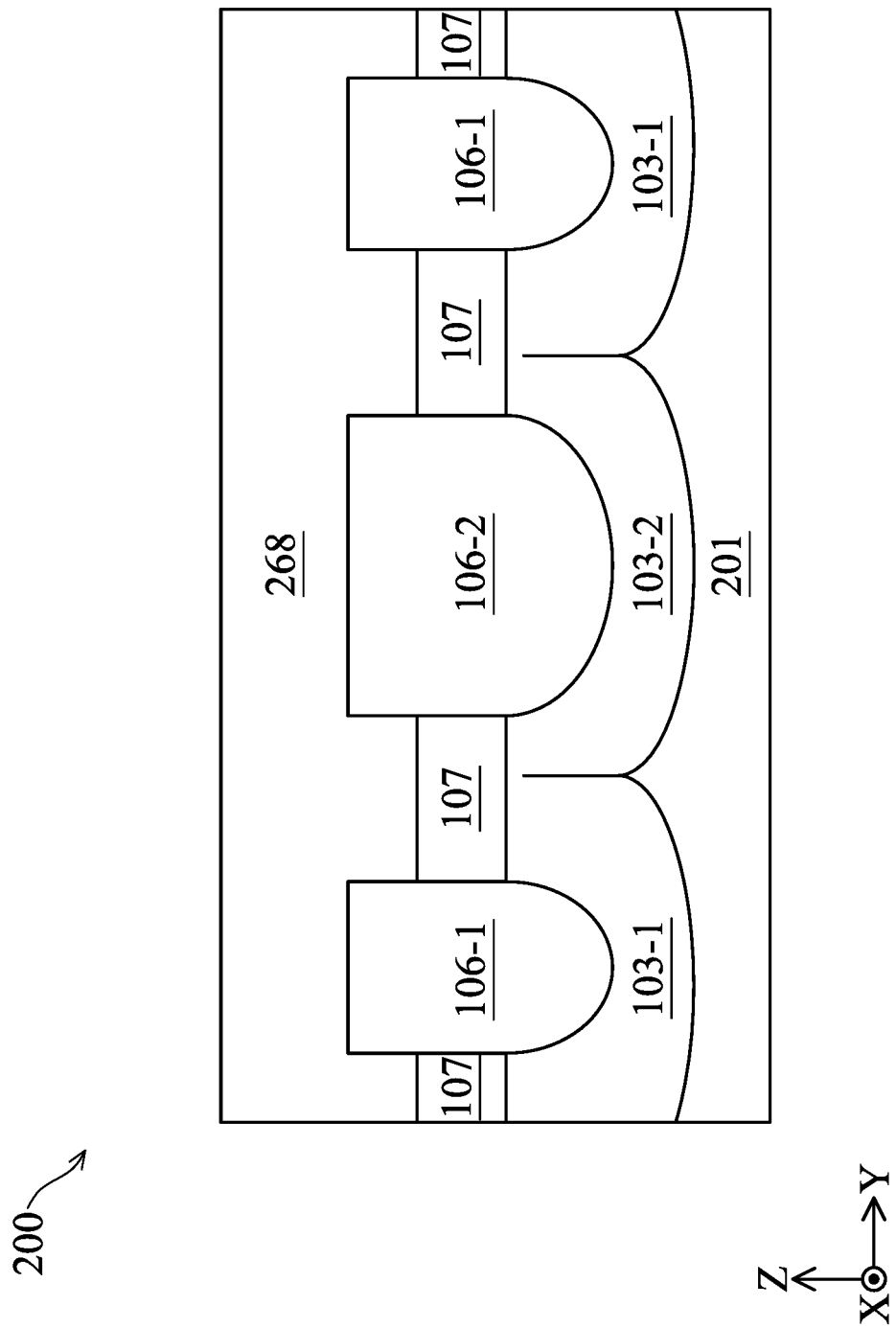
Figures 1, 1C, 2:
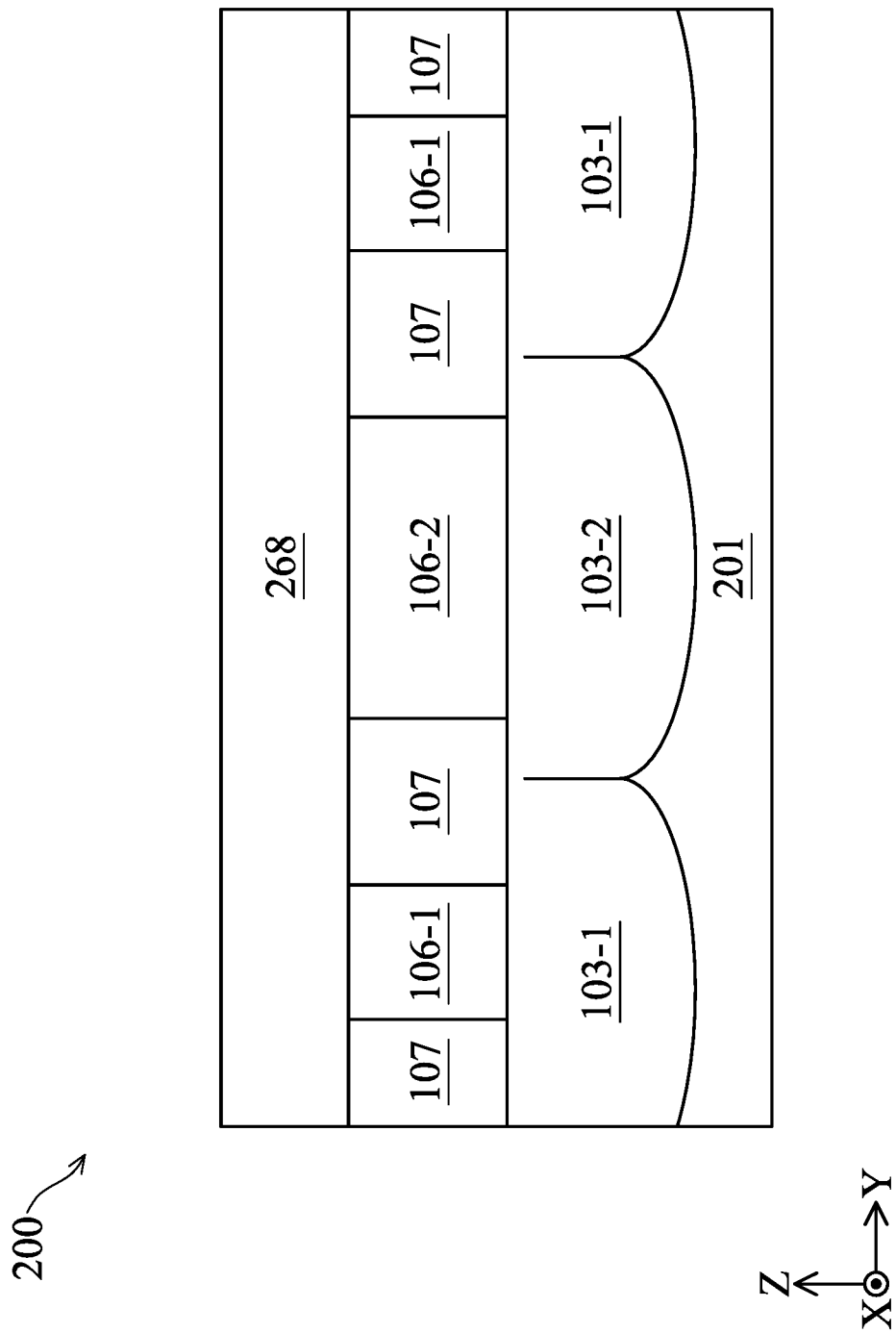
Figure 2:
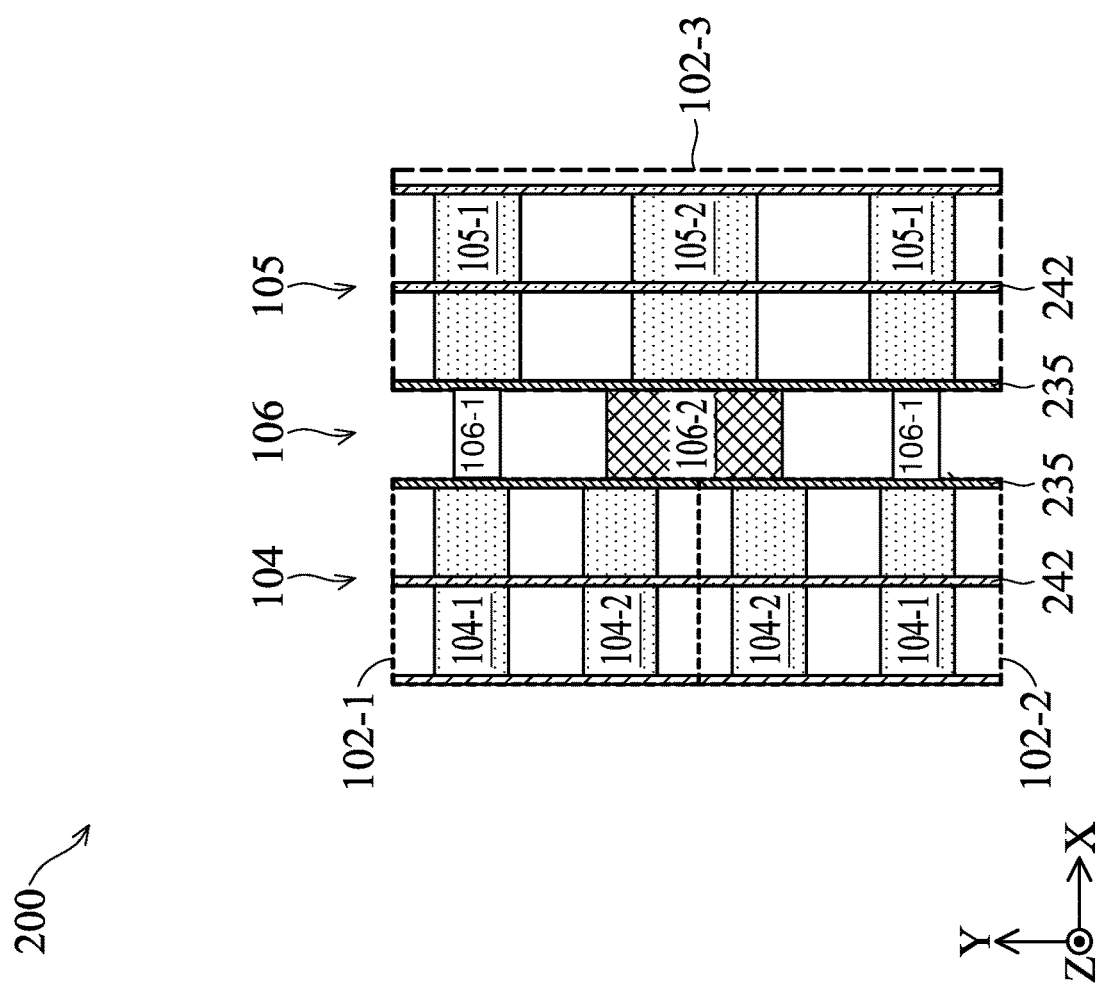
Figure 3:
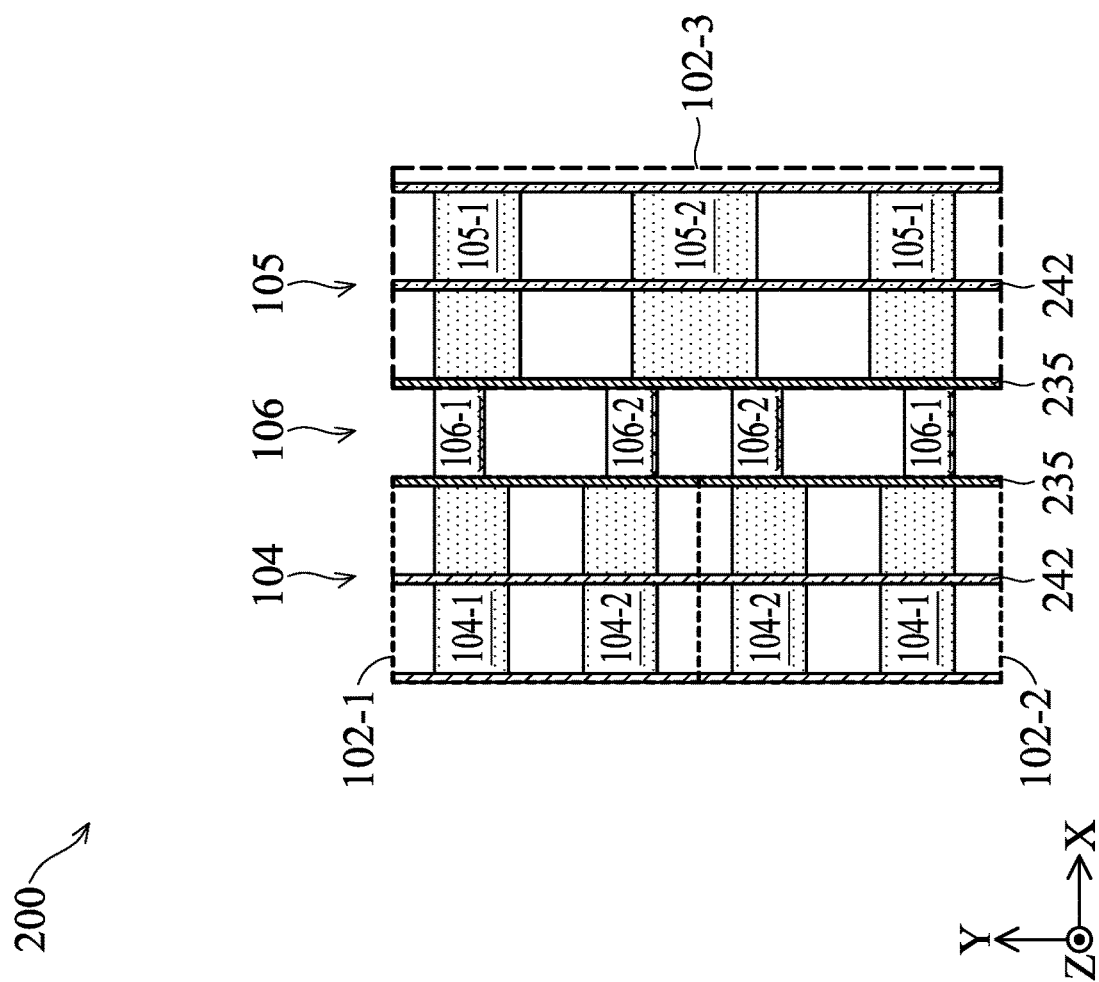

FIG. 1C-1 illustrates a fragmentary cross-sectional view of the semiconductor structure 200 taken along line C-C shown in FIG. 1A, according to an embodiment of the present disclosure where the dummy regions 106 include doped or undoped semiconductor material(s) (such as illustrated in FIGS. 1B-1 and 1B-2 above). As illustrated in FIG. 1C-1, wells 103-1 and 103-2 are formed in the substrate 201. The dummy regions 106 are formed over the wells 103-1 and 103-2. The dummy regions 106 are isolated from each other by isolation structures 107. Isolation structures 107 may comprise silicon oxide, silicon nitride, silicon oxynitride, fluoride-doped silicate glass (FSG), a low-k dielectric material, and/or other suitable insulating material. Isolation structures 107 may be shallow trench isolation (STI) features or other isolation structure such as field oxide and LOCal Oxidation of Silicon (LOCOS). In this embodiment, the top surface of the dummy regions 106 extend above the isolation structures 107.

FIG. 1C-2 illustrates a fragmentary cross-sectional view of the semiconductor structure 200 taken along line C-C shown in FIG. 1A, according to an embodiment of the present disclosure. In this embodiment, the dummy regions 106 include one or more dielectric material(s) (such as illustrated in FIG. 1B-3 above). The top surface of the dummy regions 106 and the top surface of the isolation structures 107 are co-planar or substantially co-planar. The dummy regions 106 and the isolation structures 107 may be formed by the same process or by different processes. The boundary between the dummy regions 106 and the isolation structures 107 may be visible or invisible depending on the processes of forming the dummy regions 106 and the isolation structures 107 and/or the materials used in the dummy regions 106 and the isolation structures 107.

FIG. 2 illustrates a fragmentary top view of the semiconductor structure 200, according to another embodiment of the present disclosure. The embodiment in FIG. 2 is similar to the embodiment in FIG. 1A. Some differences between the two embodiments are discussed below. In FIG. 1A, the top edge of the top dummy region 106-1 is aligned with the top edge of the top active region 104-1 and the top edge of the top active region 105-1. In FIG. 2, the top edge of the top dummy region 106-1 is misaligned with and is lower than the top edge of the top active region 104-1 and the top edge of the top active region 105-1. In FIG. 1A, the bottom edge of the bottom dummy region 106-1 is aligned with the bottom edge of the bottom active region 104-1 and the bottom edge of the bottom active region 105-1. In FIG. 2, the bottom edge of the bottom dummy region 106-1 is misaligned with and is higher than the bottom edge of the bottom active region 104-1 and the bottom edge of the bottom active region 105-1.

FIG. 3 illustrates a fragmentary top view of the semiconductor structure 200, according to another embodiment of the present disclosure. The embodiment in FIG. 3 is similar to the embodiment in FIG. 1A. Some differences between the two embodiments are discussed below. In FIG. 1A, the dummy region 106-2 is wider than the active region 105-2. The wide dummy region 106-2 in FIG. 1A is replaced with two narrower dummy regions 106-2 in FIG. 3. Each dummy region 106-2 is narrower than the active region 104-2 which is narrower than the active region 105-2. Further, the bottom edge of the top dummy region 106-2 is aligned with the bottom edge of the top active region 104-2, and the top edge of the bottom dummy region 106-2 is aligned with the top edge of the bottom active region 104-2.

The semiconductor structure 200 in FIG. 3 provides advantages over the semiconductor structure 200' in FIG. 1A-2. As discussed above, the semiconductor structure 200' in FIG. 1A-2 might have increased leakage between the two active regions 104-2 and between the active region 104-2 and the source/drain contact 275. In contrast, in the semiconductor structure 200 shown in FIG. 3, the bottom edge of the top active region 104-2 and the top edge of the bottom active region 104-2 can be well preserved through the manufacturing processes due to the presence of the dummy regions 106-2, and thus remain substantially straight even after fabrication. Advantageously, the semiconductor structure 200 shown in FIG. 3 does not have the leakage discussed above with respect to the semiconductor structure 200' in FIG. 1A-2. Additionally, the semiconductor structure 200 shown in FIG. 3 provides advantages over the semiconductor structure 200' in FIG. 1A-1 for the same reasons discussed above for the embodiment in FIG. 1A.

Figure 4:
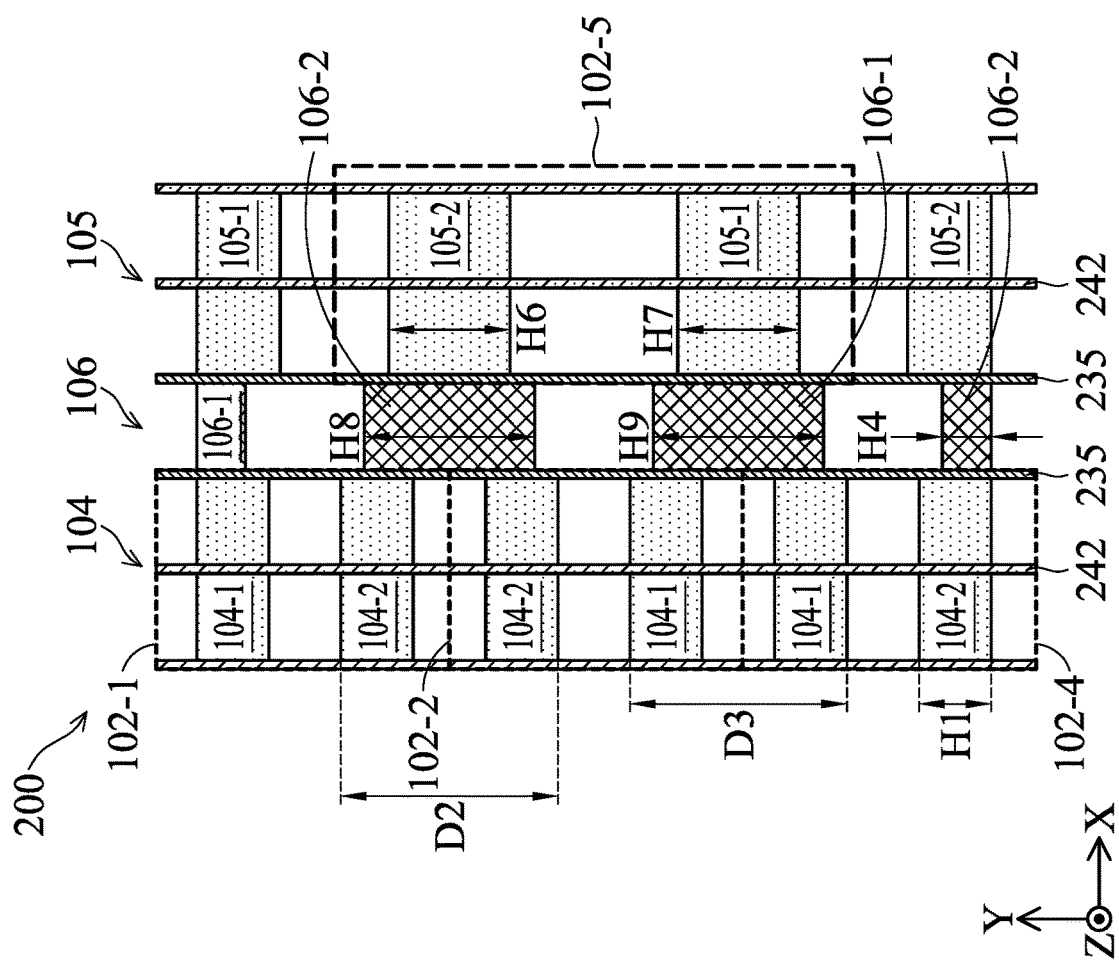

FIG. 4 illustrates a fragmentary top view of the semiconductor structure 200, according to another embodiment of the present disclosure. The active regions 104 include three active regions 104-1 and three active regions 104-2 arranged into three cells 102-1, 102-2, and 102-4 in a column. The active regions 105 include two active regions 105-1 and two active regions 105-2 arranged in a column. The middle two active regions 105-2 and 105-1 form a cell 102-5. The dummy regions 106 include two dummy regions 106-1 and two dummy regions 106-2 arranged in a column. The active region 105-1 has a height H7. The active region 105-2 has a height H6. The top dummy region 106-2 has a height H8. The bottom dummy region 106-1 has a height H9. Each of the active regions 104 has a height H1. The top dummy region 106-1 and the bottom dummy region 106-2 each have a height H4. H4 is less than H1 which is less than H6 and H7. H8 is greater than H6. H9 is greater than H7. The two adjacent active regions 104-2 and the isolation structure in between collectively have a height D2. The two adjacent active regions 104-1 and the isolation structure in between collectively have a height D3. D2 is greater than H8. D3 is greater than H9. The design of these dimensions helps increase the design margin associated with the active regions 104 and 105 and the wells and between the active regions and nearby source/drain contacts.

The top dummy region 106-1 is disposed between the top active region 104-1 and the top active region 105-1. The top edge of the top dummy region 106-1 is aligned with the top edge of the top active region 104-1 and the top edge of the top active region 105-1. The bottom edge of the top dummy region 106-1, the bottom edge of the top active region 104-1, and the bottom edge of the top active region 105-1 are misaligned, with four 90-degree bends.

The bottom dummy region 106-2 is disposed between the bottom active region 104-2 and the bottom active region 105-2. The bottom edge of the bottom dummy region 106-2 is aligned with the bottom edge of the bottom active region 104-2 and the bottom edge of the bottom active region 105-2. The top edge of the bottom dummy region 106-2, the top edge of the bottom active region 104-2, and the top edge of the bottom active region 105-2 are misaligned, with four 90-degree bends.

The top dummy region 106-2 is disposed between the top two active regions 104-2 and the top active region 105-2. The top edge of the top dummy region 106-2, the top edge of the top active region 104-2, and the top edge of the top active region 105-2 are misaligned, with four 90-degree bends. The bottom edge of the top dummy region 106-2, the bottom edge of the second-from-the-top active region 104-2, and the bottom edge of the top active region 105-2 are misaligned, with four 90-degree bends.

The bottom dummy region 106-1 is disposed between the bottom two active regions 104-1 and the bottom active region 105-1. The top edge of the bottom dummy region 106-1, the top edge of the second-from-the-top active region 104-1, and the top edge of the bottom active region 105-1 are misaligned, with four 90-degree bends. The bottom edge of the bottom dummy region 106-1, the bottom edge of the third-from-the-top active region 104-1, and the bottom edge of the bottom active region 105-1 are misaligned, with four 90-degree bends.

Figure 5:
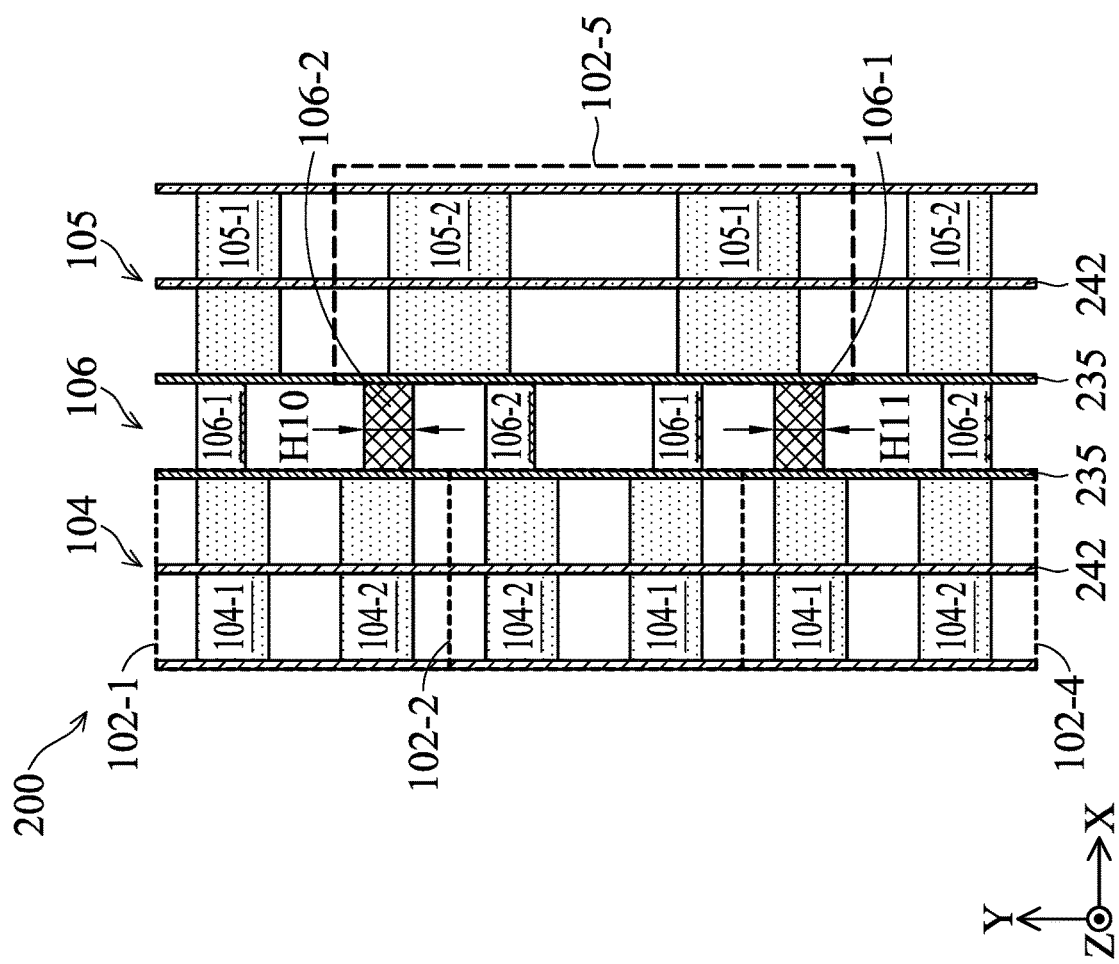

FIG. 5 illustrates a fragmentary top view of the semiconductor structure 200, according to another embodiment of the present disclosure. The embodiment in FIG. 5 is similar to the embodiment in FIG. 4. Some differences between the two embodiments are discussed below. In FIG. 4, the dummy regions 106-2 and 106-1 in the middle are wider than the active regions 105-2 and 105-1, respectively. The wide dummy region 106-2 in FIG. 4 is replaced with two narrower dummy regions 106-2 in FIG. 5, each having a height H10. The wide dummy region 106-1 in FIG. 4 is replaced with two narrower dummy regions 106-1 in FIG. 5, each having a height H11. Each dummy region 106 in FIG. 5 is narrower than each active region 104. The bottom edge of the top dummy region 106-2 is aligned with the bottom edge of the top active region 104-2, and the top edge of the second-from-the-top dummy region 106-2 is aligned with the top edge of the second-from-the-top active region 104-2. The bottom edge of the second-from-the-top dummy region 106-1 is aligned with the bottom edge of the second-from-the-top active region 104-1, and the top edge of the thirdfrom-the-top dummy region 106-1 is aligned with the top edge of the third-from-the-top active region 104-1. Advantageously, the semiconductor structure 200 shown in FIG. 5 reduces the leakage discussed above with respect to the semiconductor structure 200' in FIG. 1A-2. Additionally, the semiconductor structure 200 shown in FIG. 5 provides advantages over the semiconductor structure 200' in FIG. 1A-1 for the same reasons discussed above for the embodiment in FIG. 1A.

Figure 6A:
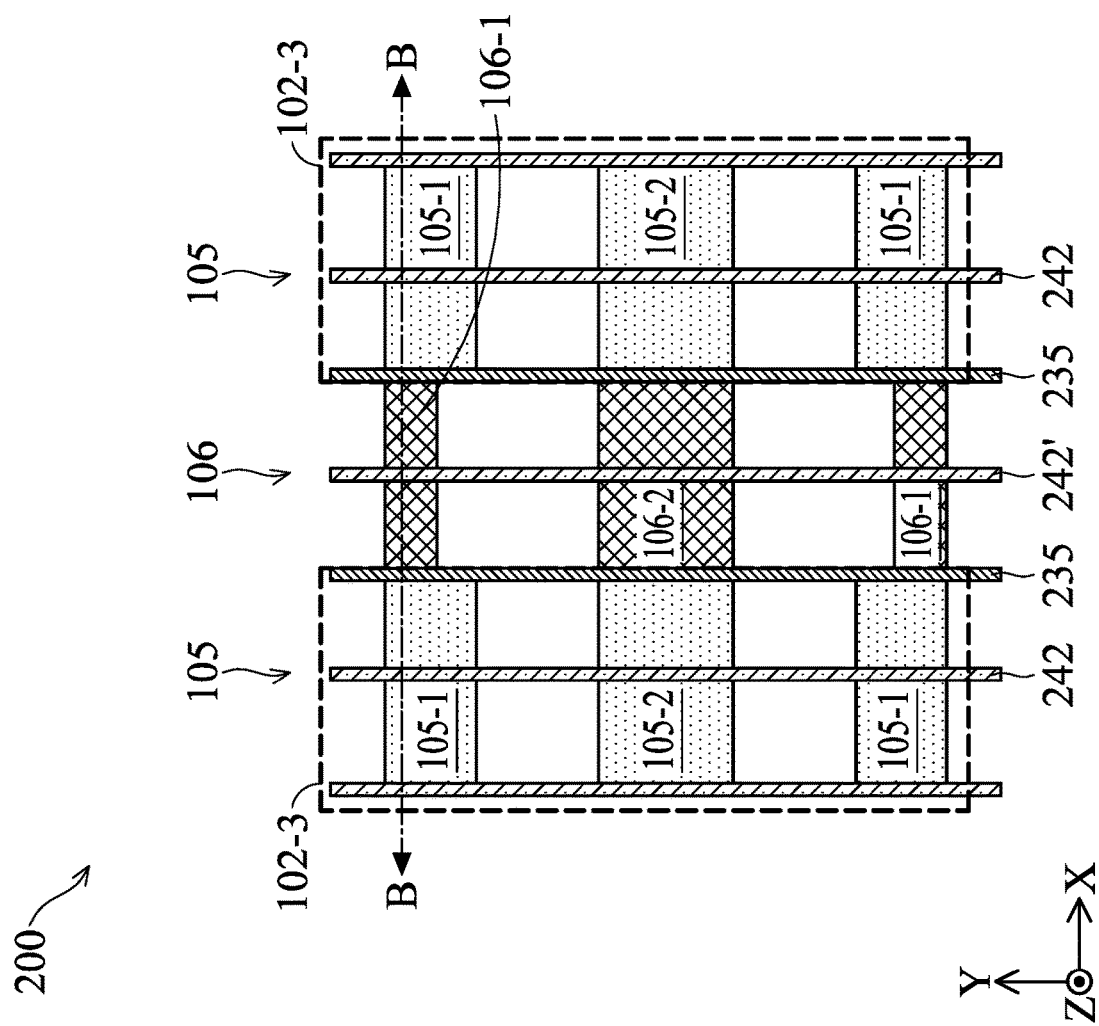

FIG. 6A illustrates a fragmentary top view of the semiconductor structure 200, according to another embodiment of the present disclosure. In this embodiment, the dummy regions 106 are disposed between two cells 102-3. Each cell 102-3 includes an active region 105-2 between two active regions 105-1. Each active region 105-2 is wider than each active region 105-1. Further, the dummy region 106-2 has the same height (or width) as the active region 105-2, and the dummy region 106-1 is narrower than the active region 105-1. The top edge of the top dummy region 106-1 and the top edges of the top active regions 105-1 are aligned. The bottom edge of the top dummy region 106-1 and the bottom edges of the top active regions 105-1 are misaligned, with four 90-degree bends. The bottom edge of the bottom dummy region 106-1 and the bottom edges of the bottom active regions 105-1 are aligned. The top edge of the bottom dummy region 106-1 and the top edges of the bottom active regions 105-1 are misaligned, with four 90-degree bends. The top edges of the active regions 105-2 and the dummy region 106-2 are aligned. The bottom edges of the active regions 105-2 and the dummy region 106-2 are aligned. Advantageously, the semiconductor structure 200 shown in FIG. 6A reduces the leakage discussed above with respect to the semiconductor structure 200' in FIG. 1A-2. Additionally, the semiconductor structure 200 shown in FIG. 6A provides advantages over the semiconductor structure 200' in FIG. 1A-1 for the same reasons discussed above for the embodiment in FIG. 1A.

Further, the dummy regions 106 in the embodiment in FIG. 6A is wider than the dummy regions 106 in the embodiments in FIGS. 1A, 2, 3, 4, and 5, along the X direction. In the embodiments in FIGS. 1A, 2, 3, 4, and 5, the width of the dummy regions 106 is about one poly-to-poly pitch (referred to as poly-pitch). In the embodiment in FIG. 6A, the width of the dummy regions 106 is about two poly-pitches. As a result, a gate structure 242' may be formed over the dummy regions 106. The gate structure 242' is a dummy gate (e.g., it is a dielectric gate or it is a high-k metal gate that is not connected to other parts of the semiconductor structure 200).

Figures 1, 6B:
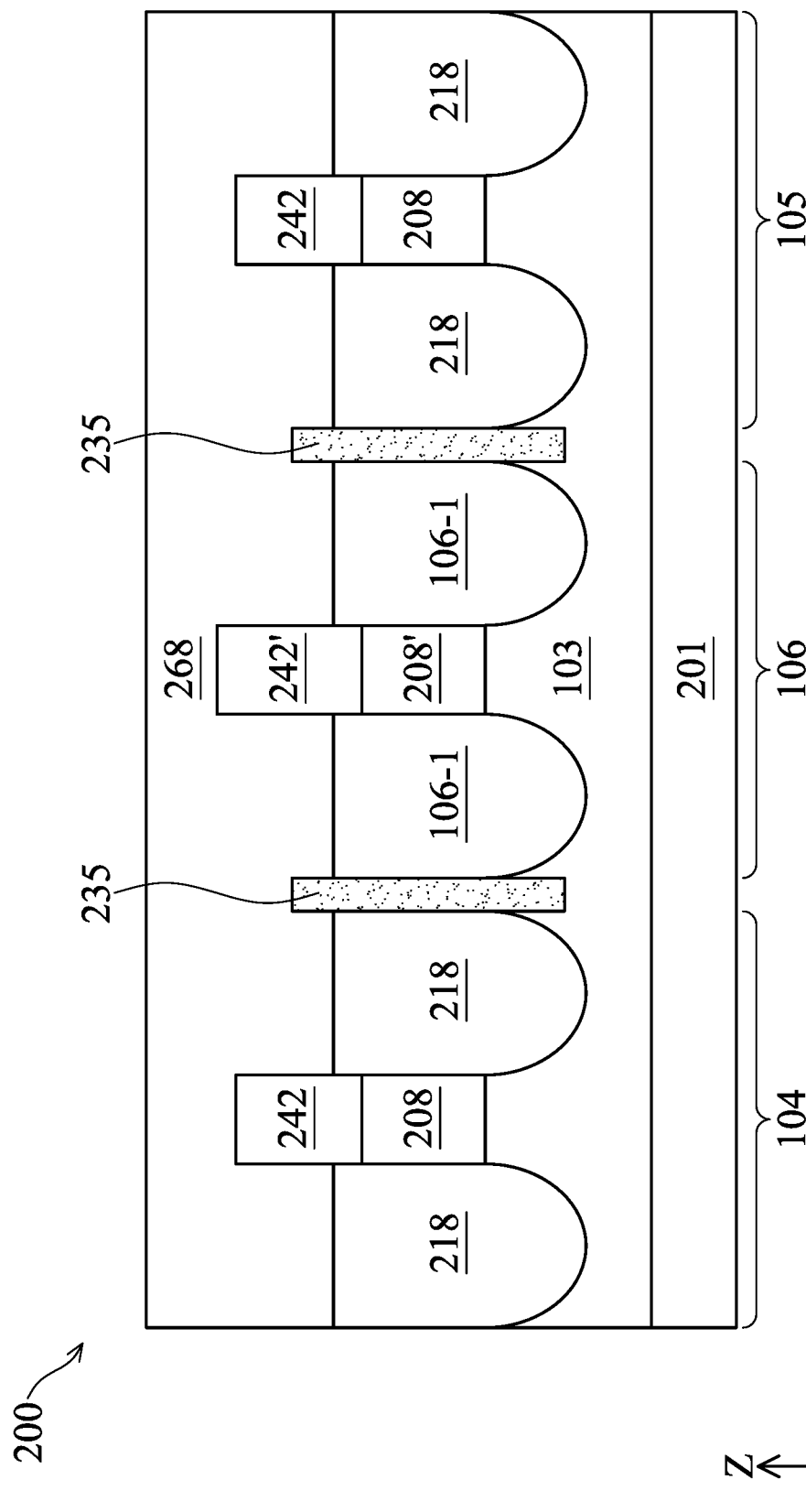
Figures 2, 6B:
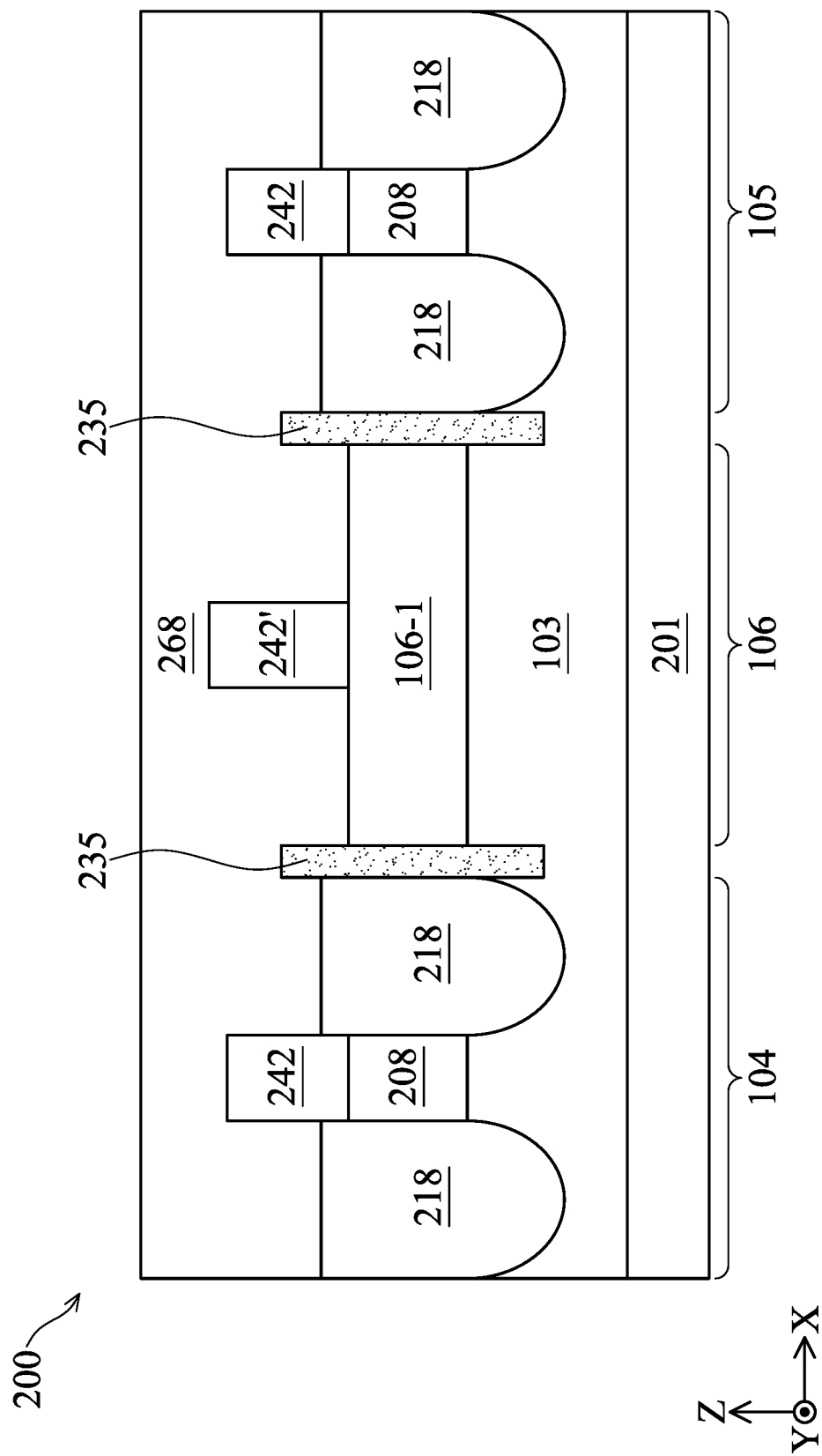

FIG. 6B-1 illustrates a fragmentary cross-sectional view of the semiconductor structure 200 taken along line B-B shown in FIG. 6A, according to an embodiment of the present disclosure where the dummy regions 106 include doped or undoped semiconductor material(s). In the embodiment shown in FIG. 6B-1, each of the active regions 105 includes two source/drain regions 218 and a semiconductor channel region 208 connecting the two source/drain regions 218. The semiconductor channel region 208 may be in the shape of a semiconductor fin (e.g., for FinFETs) as shown in FIG. 6B-1 or may include a stack of nano-sized channels (not shown) similar to FIG. 1B-2. As illustrated in FIG. 6B-1, dummy regions 106-1, dummy channel 208', and dummy gate structure 242' are formed between the isolation structures 235. The dummy regions 106-1 may be formed in the same processes as for the source/drain regions 218, as discussed with respect to FIG. 1B-1. The dummy channel 208' may include the same material as the channel region 208.

FIG. 6B-2 illustrates a fragmentary cross-sectional view of the semiconductor structure 200 taken along line B-B shown in FIG. 6A, according to an embodiment of the present disclosure where the dummy regions 106 include one or more dielectric materials. For example, the dummy regions 106 may be formed as an isolation structure, such as shallow trench isolation (STI), as discussed with respect to FIG. 1B-3. As illustrated in FIG. 6B-2, dummy region 106-1 and dummy gate structure 242' are formed between the isolation structures 235.

Figure 7:
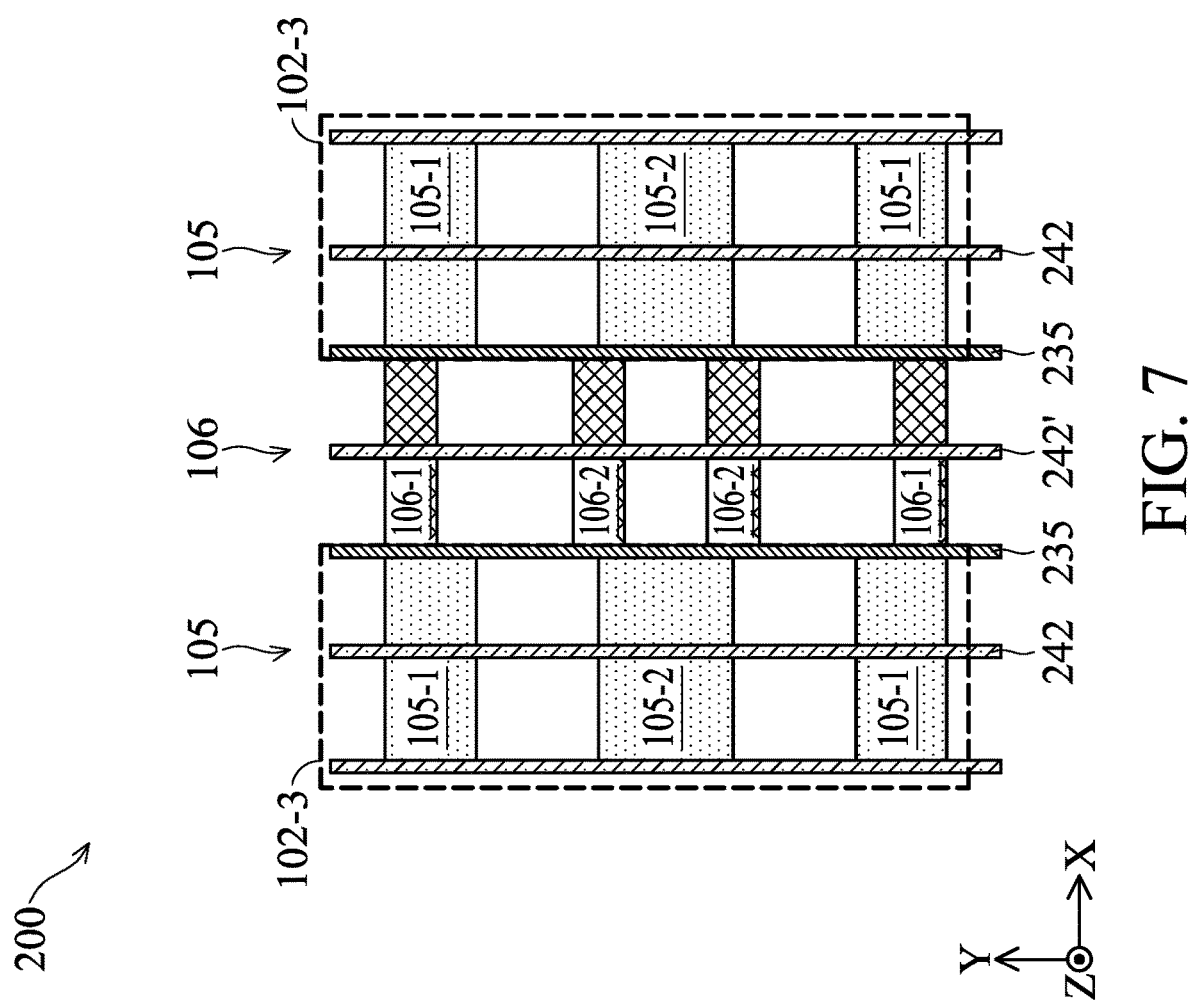

FIG. 7 illustrates a fragmentary top view of the semiconductor structure 200, according to another embodiment of the present disclosure. The embodiment in FIG. 7 is similar to the embodiment in FIG. 6A. Some differences between the two embodiments are discussed below. In FIG. 6A, the dummy region 106-2 has the same height (or width) as the active region 105-2. The dummy region 106-2 in FIG. 6A is replaced with two narrower dummy regions 106-2 in FIG. 7. Each dummy region 106-2 is narrower than the active region 105-1 which is narrower than the active region 105-2. Further, the dummy regions 106-1 and 106-2 have about the same height along the Y direction. Further, the top and bottom edges of the dummy regions 106-2 are misaligned with the top and bottom edges of the active regions 105-2.

Figure 8:
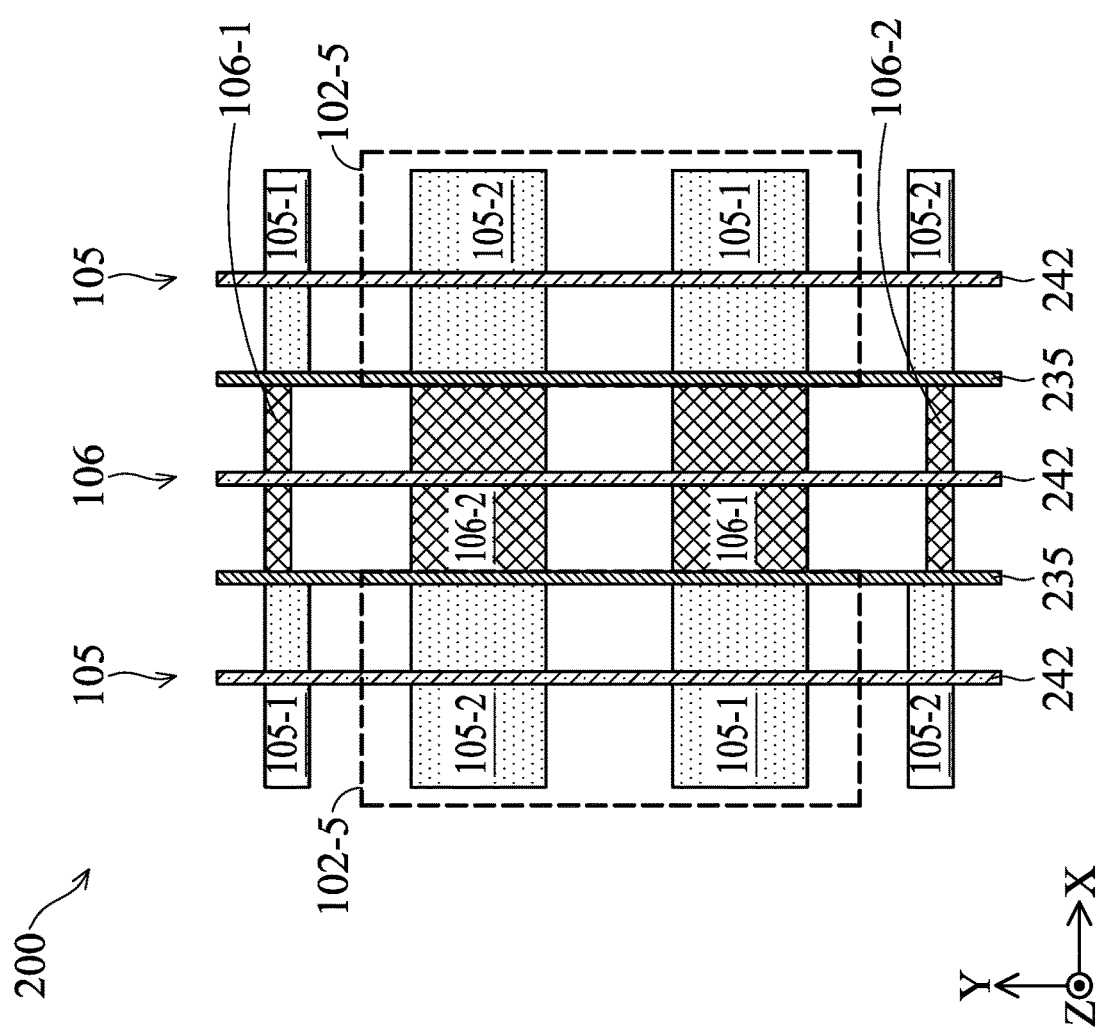

FIG. 8 illustrates a fragmentary top view of the semiconductor structure 200, according to another embodiment of the present disclosure. The embodiment in FIG. 8 is similar to the embodiment in FIG. 6A. The dummy regions 106 are 2 poly-pitch wide. Each cell 102-5 includes a wide active region 105-1 and a wide active region 105-2. There are other, narrower active regions 105 in the columns. The middle two dummy regions 106-2, 106-1 have the same height (or width) as the middle two active regions 105-2 and 105-1. Their respective top edges are aligned. Their respective bottom edges are also aligned. The top edge of the top dummy region 106-1 and the top edges of the top active regions 105-1 are aligned. The bottom edge of the top dummy region 106-1 and the bottom edges of the top active regions 105-1 are misaligned, with four 90-degree bends. The bottom edge of the bottom dummy region 106-2 and the bottom edges of the bottom active regions 105-2 are aligned. The top edge of the bottom dummy region 106-2 and the top edges of the bottom active regions 105-2 are misaligned, with four 90-degree bends.

Figure 9:
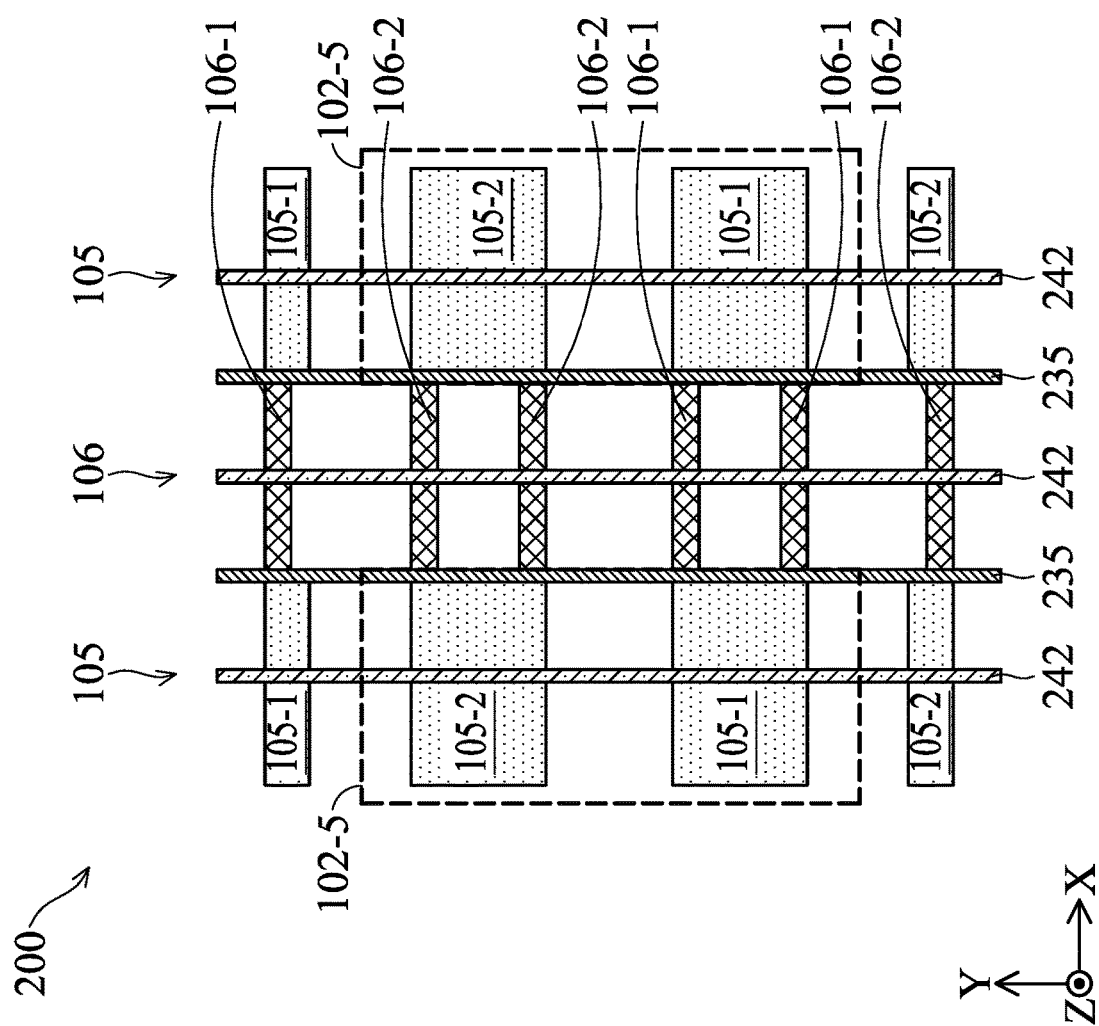

FIG. 9 illustrates a fragmentary top view of the semiconductor structure 200, according to another embodiment of the present disclosure. The embodiment in FIG. 9 is similar to the embodiment in FIG. 8. Some differences between the two embodiments are discussed below. In FIG. 8, the middle two dummy regions 106-2, 106-1 have the same height (or width) as the active region 105-2, 105-1, respectively. Each of the two middle dummy regions 106 in FIG. 8 is replaced with two narrower dummy regions 106 in FIG. 9. The top and bottom edges of the narrower dummy regions 106 in FIG. 9 may or may not be aligned with the active regions 105.

Figure 10:
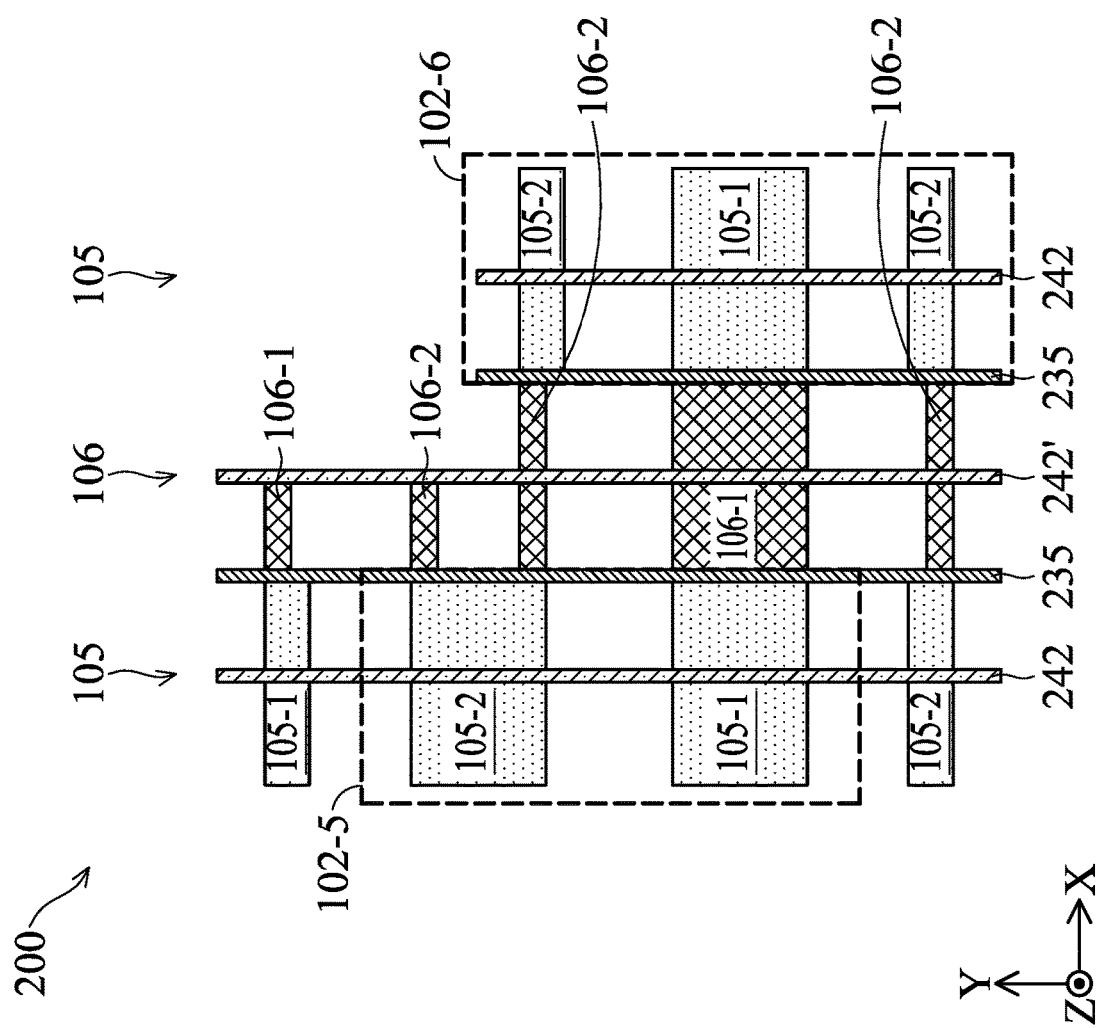

FIG. 10 illustrates a fragmentary top view of the semiconductor structure 200, according to another embodiment of the present disclosure. The semiconductor structure 200 includes a cell 102-6 that includes an active region 105-1 and two active regions 105-2 where the active region 105-1 is taller (or wider) than each of the two active regions 105-2. The cell 102-5 includes an active region 105-1 and an active region 105-2 that have about the same height. There are other active regions 105 in the columns. The dummy regions 106 includes a wide dummy region 106-1 that has its top and bottom edges aligned with the respective top and bottom edges of the active regions 105-1 in the cells 102-5 and 102-6. Other dummy regions 106 are narrower. The dummy regions 106 are 2 poly-pitch wide.

Figure 11:
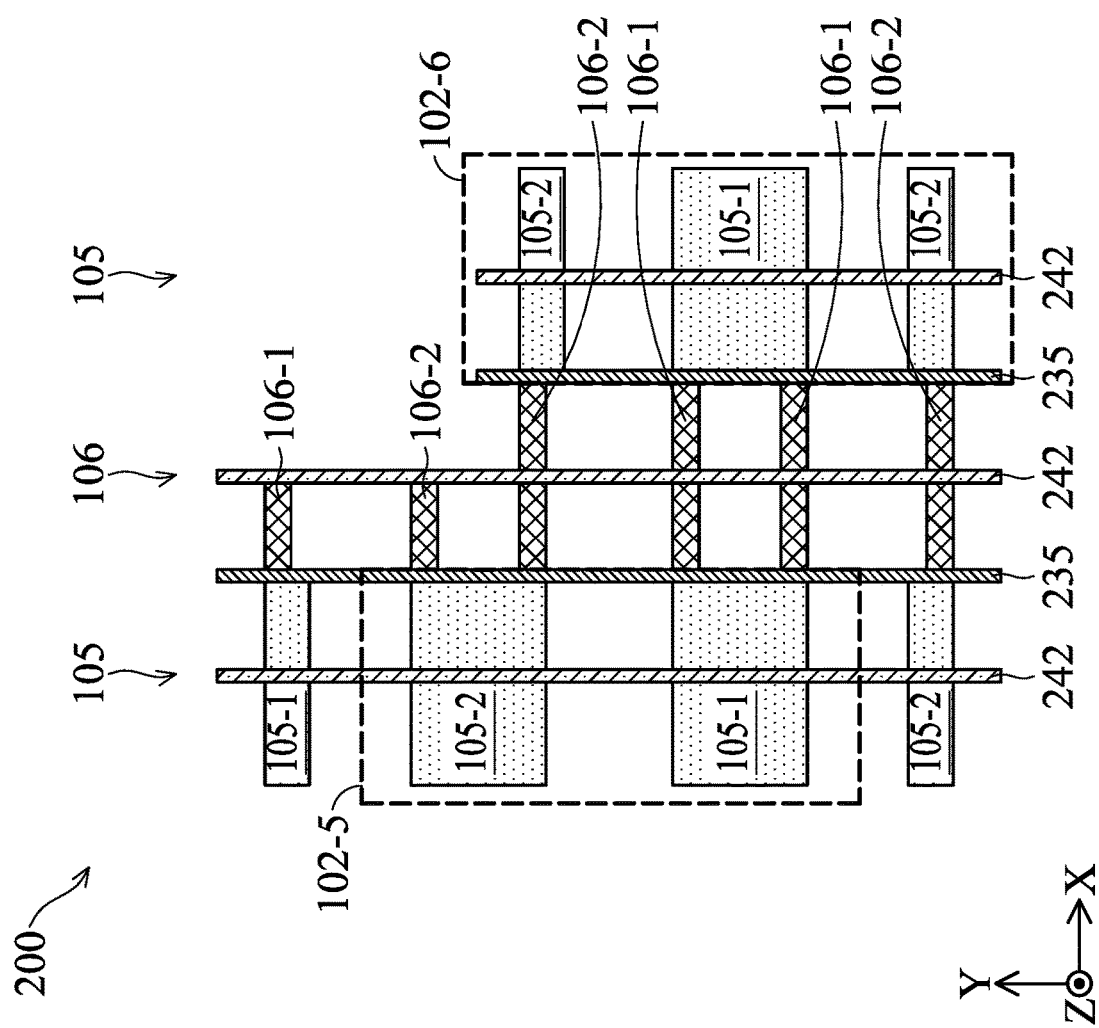

FIG. 11 illustrates a fragmentary top view of the semiconductor structure 200, according to another embodiment of the present disclosure. The embodiment in FIG. 11 is similar to the embodiment in FIG. 10. The wide dummy region 106-1 in FIG. 10 is replaced with two narrower dummy regions 106-1 in FIG. 11 and are disposed between the active regions 105-1 of the cells 102-5 and 102-6.

Figure 12:
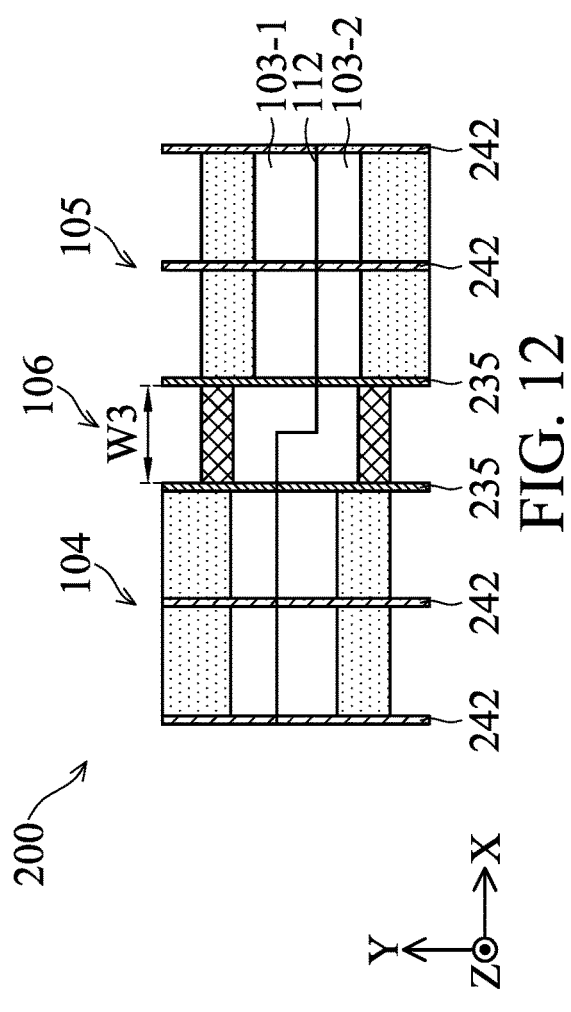
Figure 13:
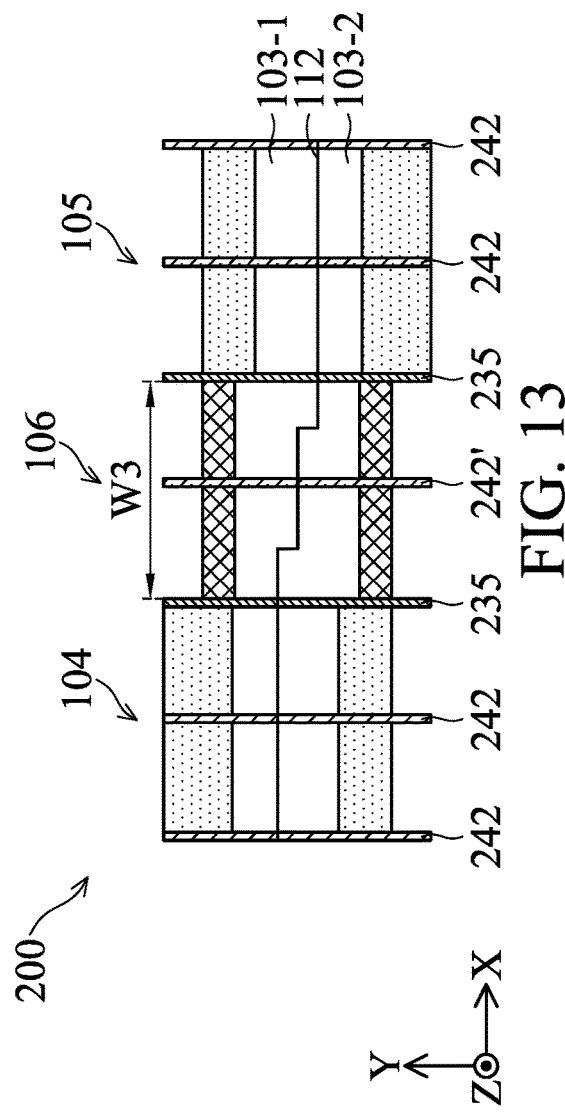
Figure 14:
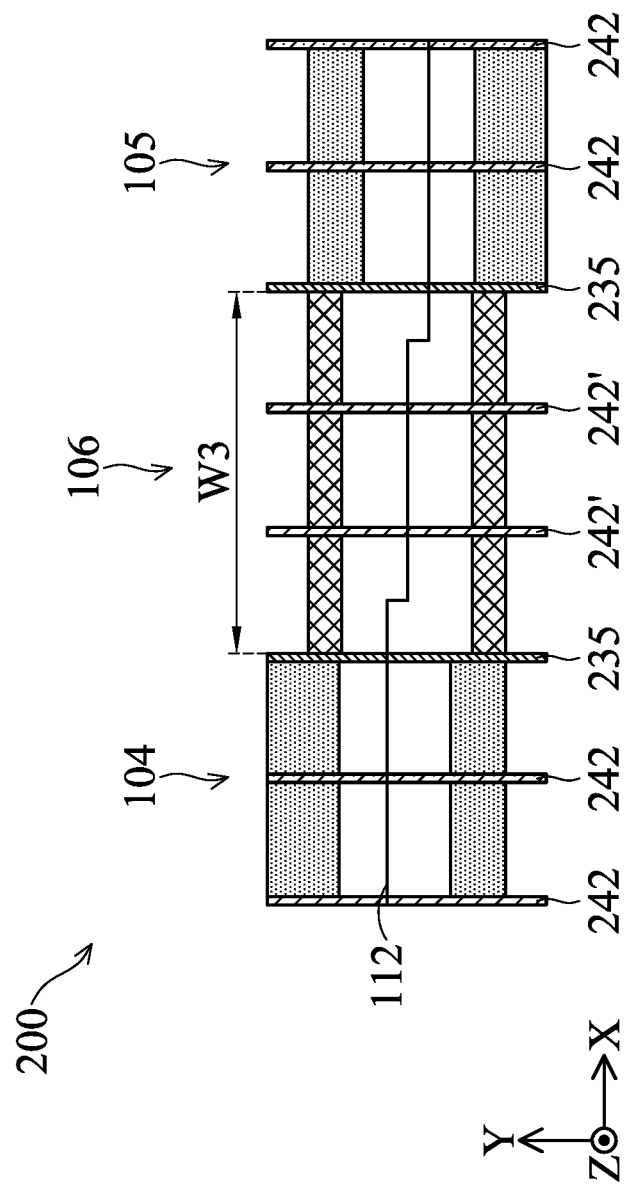

FIGS. 12, 13, and 14 illustrate fragmentary top views of the semiconductor structure 200, according to three embodiments of the present disclosure, respectively. In the three embodiments, the width W3 of the dummy regions 106 are different from each other. In the embodiment shown in FIG. 12, the width W3 of the dummy regions 106 is about one poly-pitch (i.e., it is about equal to one pitch of the gate structures 242). In the embodiment shown in FIG. 13, the width W3 of the dummy regions 106 is about two poly-pitches (i.e., it is about equal to two pitches of the gate structures 242). In the embodiment shown in FIG. 14, the width W3 of the dummy regions 106 is about three poly-pitches (i.e., it is about equal to three pitches of the gate structures 242). As shown in the three embodiments, the bends in the boundary line 112 are disposed in the column of dummy regions 106. There may be two bends in the boundary line 112, such as show in FIG. 12, or there may be four bends in the boundary line 112, such as show in FIGS. 13 and 14. In alternative embodiments, the four bends in the boundary line 112 in FIGS. 13-14 may be replaced with two bends such as shown in FIG. 12. When the width W3 is greater than one poly-pitch, dummy gate structures 242's may be implemented in the column of dummy regions 106.

In various embodiments, the disclosed dummy regions 106 may be inserted during a design phase, such as during automatic place and route. The dummy regions 106 may be inserted between two columns of active regions when the lateral space (e.g., along the X direction in FIG. 1A) between the two columns of active regions is less than four poly-pitches. In the embodiments in FIGS. 12, 13, and 14, the lateral space between the two columns of active regions is one poly-pitch, two poly-pitches, and three poly-pitches, respectively. When the lateral space between the two columns of active regions is equal to or greater than four poly-pitches, a column of active regions may be inserted (because an active cell is at least two poly-pitch wide).

Although not intended to be limiting, one or more embodiments of the present disclosure provide many benefits to a semiconductor structure and the formation thereof. For example, the present disclosure provides embodiments of a semiconductor structure or a layout thereof which implement a dummy padding between two columns of active regions. The dummy padding provides various benefits to the semiconductor structure, including increased design margin and reduced leakage between an active region and an adjacent well, increased design margin and reduced leakage between two adjacent active regions, and increased design margin and reduced leakage between an active region and an adjacent source/drain contact.

In an example aspect, the present disclosure is directed to a semiconductor structure that includes a substrate; a first column of active regions over the substrate; a second column of active regions over the substrate; and a dummy padding disposed between the first and the second columns from a top view. The dummy padding includes multiple dummy regions. A first dummy region of the multiple dummy regions is disposed between a first active region in the first column of active regions and a second active region in the second column of active regions. An outer boundary line tracing an edge of the first active region, an edge of the first dummy region, and an edge of the second active region includes at least two substantially 90-degree bends from a top view. The first and the second active regions include a semiconductor material doped with a same dopant.

In an embodiment of the semiconductor structure, the first and the second active regions and the first dummy region are at a same vertical level above the substrate. In another embodiment, the first dummy region includes the semiconductor material doped with the same dopant. In yet another embodiment, the first dummy region includes a dielectric material.

In an embodiment of the semiconductor structure, the second active region is wider than the first active region along a first direction parallel to the first and the second columns from a top view. In a further embodiment, an edge of the first active region and an edge of the second active region are substantially aligned along a second direction perpendicular to the first direction. In another further embodiment, the first dummy region is narrower than both the first and the second active regions along the first direction.

In another embodiment, the semiconductor structure further includes a first isolation structure between the first column and the dummy padding and a second isolation structure between the second column and the dummy padding.

In another example aspect, the present disclosure is directed to a semiconductor structure that includes a substrate, a first cell comprising a first active region of a first conductivity type and a second active region of a second conductivity type that is opposite to the first conductivity type, and a second cell comprising a third active region of the first conductivity type and a fourth active region of the second conductivity type. From a top view, the first, the second, the third, and the fourth active regions are disposed in a first column and the second and the fourth active regions are disposed between the first and the third active regions in the first column. The semiconductor structure further includes a third cell comprising fifth and seventh active regions of the first conductivity type and a sixth active region of the second conductivity type. From a top view, the fifth, the sixth, and the seventh active regions are disposed in a second column and the sixth active region is disposed between the fifth and the seventh active regions in the second column. The semiconductor structure further includes a dummy padding disposed between the first and the second columns from a top view. The dummy padding includes a first dummy region between the first active region and the fifth active region, a second dummy region between the second active region and the sixth active region, and a third dummy region between the third active region and the seventh active region. The first through seventh active regions and the first through third dummy regions are at a same vertical level above the substrate.

In an embodiment, the semiconductor structure further includes a first well formed in the substrate and being of the second conductivity type and a second well formed in the substrate and being of the first conductivity type. The first and the fifth active regions and the first dummy region are over the first well. the second, the fourth, and the sixth active region are over the second well. From a top view, a boundary line between the first well and the second well includes two bends that are disposed between the first column and the second column.

In an embodiment of the semiconductor structure, from a top view, the fifth active region is wider than the first active region and an edge of the first active region and an edge of the fifth active region are substantially aligned. In a further embodiment, from a top view, an edge of the first dummy region is substantially aligned with the edge of the first active region and the edge of the fifth active region.

In an embodiment, the second dummy region is also between the fourth active region and the sixth active region. In another embodiment, each of the first dummy region and the first and the fifth active regions includes a semiconductor material doped with dopants of the first conductivity type. In yet another embodiment, each of the first through third dummy regions includes a dielectric material.

In an embodiment, the semiconductor structure further includes a first isolation structure between the first column and the dummy padding and a second isolation structure between the second column and the dummy padding. Each of the first and the second isolation structures is oriented lengthwise parallel to the first and the second columns.

In yet another example aspect, the present disclosure is directed to an integrated circuit layout that includes a first CMOS cell, a second CMOS cell, a third CMOS cell, and a dummy padding. The first CMOS cell includes a first active region of a first conductivity type and a second active region of a second conductivity type that is opposite to the first conductivity type. The second CMOS cell includes a third active region of the first conductivity type and a fourth active region of the second conductivity type. From a top view, the first, the second, the third, and the fourth active regions are disposed in a first column and the second and the fourth active regions are disposed between the first and the third active regions in the first column. The third CMOS cell includes a fifth active region of the first conductivity type, a sixth active region of the second conductivity type, and a seventh active region of the first conductivity type. From a top view, the fifth, the sixth, and the seventh active regions are disposed in a second column and the sixth active region is disposed between the fifth and the seventh active regions in the second column. Each of the fifth and the seventh active regions is wider than each of the first and the third active regions. The sixth active region is wider than each of the second and the fourth active regions. The dummy padding is disposed between the first and the second columns from a top view. The dummy padding includes a first dummy region between the first and the fifth active regions, a second dummy region between each of the second and the fourth active regions and the sixth active region, and a third dummy region between the third and the seventh active regions.

In an embodiment of the integrated circuit layout, a top edge of the first active region, a top edge of the first dummy region, and a top edge of the fifth active region are substantially aligned.

In an embodiment, the integrated circuit layout further includes a first well of the second conductivity type and a second well of the first conductivity type. The first active region, the first dummy region, and the fifth active region are in the first well from a top view. The second and the fourth active regions and the sixth active region are in the second well from a top view. A boundary line between the first well and the second well includes two bends that are disposed between the first column and the second column.

In another embodiment, a width of the second dummy region is greater than a width of the sixth active region and is smaller than a distance from a top edge of the second active region to a bottom edge of the fourth active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first column of active regions over the substrate;
   a second column of active regions over the substrate; and
   a dummy padding disposed between the first column of active regions and the second column of active regions from a top view, wherein the dummy padding includes multiple dummy regions, a first dummy region of the multiple dummy regions is disposed between a first active region in the first column of active regions and a second active region in the second column of active regions, an outer boundary line tracing an edge of the first active region, an edge of the first dummy region, and an edge of the second active region includes at least two substantially 90-degree bends from a top view, wherein the first and the second active regions include a semiconductor material doped with a same dopant, wherein, the first active region extends lengthwise along a first direction and has a first dimension along a second direction different from the first direction, the first dummy region has a second dimension along the second direction, the second dimension is less than the first dimension.

2. The semiconductor structure of claim 1, wherein the first and the second active regions and the first dummy region are at a same vertical level above the substrate.

3. The semiconductor structure of claim 1, wherein the first dummy region includes the semiconductor material doped with the same dopant.

4. The semiconductor structure of claim 1, wherein the first dummy region includes a dielectric material.

5. The semiconductor structure of claim 1, wherein the second active region has a third dimension along the second direction, the third dimension is greater than the second dimension.

6. The semiconductor structure of claim 5, wherein an edge of the first active region and an edge of the second active region are substantially aligned along the first direction.

7. The semiconductor structure of claim 5, wherein the first dimension is less than the third dimension.

8. The semiconductor structure of claim 1, further comprising:
   a first isolation structure between the first column of active regions and the dummy padding; and
   a second isolation structure between the second column of active regions and the dummy padding.

9. A semiconductor structure, comprising:
   a substrate;

a first cell comprising a first active region of a first conductivity type and a second active region of a second conductivity type that is opposite to the first conductivity type;

a second cell comprising a third active region of the first conductivity type and a fourth active region of the second conductivity type, wherein from a top view, the first, the second, the third, and the fourth active regions are disposed in a first column and the second and the fourth active regions are disposed between the first and the third active regions in the first column;

a third cell comprising fifth and seventh active regions of the first conductivity type and a sixth active region of the second conductivity type, wherein from a top view, the fifth, the sixth, and the seventh active regions are disposed in a second column and the sixth active region is disposed between the fifth and the seventh active regions in the second column; and a dummy padding disposed between the first and the second columns from a top view, wherein the dummy padding includes a first dummy region between the first active region and the fifth active region, a second dummy region between the second active region and the sixth active region, and a third dummy region between the third active region and the seventh active region, wherein the first through seventh active regions and the first through third dummy regions are at a same vertical level above the substrate.

10. The semiconductor structure of claim 9, further comprising:
a first well formed in the substrate and being of the second conductivity type; and
a second well formed in the substrate and being of the first conductivity type, wherein the first and the fifth active regions and the first dummy region are over the first well, wherein the second, the fourth, and the sixth active region are over the second well, wherein from a top view, a boundary line between the first well and the second well includes two bends that are disposed between the first column and the second column.

11. The semiconductor structure of claim 9, wherein from a top view, the fifth active region is wider than the first active region and an edge of the first active region and an edge of the fifth active region are substantially aligned.

12. The semiconductor structure of claim 11, wherein from a top view, an edge of the first dummy region is substantially aligned with the edge of the first active region and the edge of the fifth active region.

13. The semiconductor structure of claim 9, wherein the second dummy region is also between the fourth active region and the sixth active region.

14. The semiconductor structure of claim 9, wherein each of the first dummy region and the first and the fifth active regions includes a semiconductor material doped with dopants of the first conductivity type.

15. The semiconductor structure of claim 9, wherein each of the first through third dummy regions includes a dielectric material.

16. The semiconductor structure of claim 9, further comprising:
a first isolation structure between the first column and the dummy padding; and
a second isolation structure between the second column and the dummy padding, wherein each of the first and the second isolation structures is oriented lengthwise parallel to the first and the second columns.

17. An integrated circuit layout, comprising:
a first CMOS cell comprising a first active region of a first conductivity type and a second active region of a second conductivity type that is opposite to the first conductivity type;
a second CMOS cell comprising a third active region of the first conductivity type and a fourth active region of the second conductivity type, wherein from a top view, the first, the second, the third, and the fourth active regions are disposed in a first column and the second and the fourth active regions are disposed between the first and the third active regions in the first column;
a third CMOS cell comprising a fifth active region of the first conductivity type, a sixth active region of the second conductivity type, and a seventh active region of the first conductivity type, wherein from a top view, the fifth, the sixth, and the seventh active regions are disposed in a second column and the sixth active region is disposed between the fifth and the seventh active regions in the second column, wherein each of the fifth and the seventh active regions is wider than each of the first and the third active regions, wherein the sixth active region is wider than each of the second and the fourth active regions; and
a dummy padding disposed between the first and the second columns from a top view, wherein the dummy padding includes a first dummy region between the first and the fifth active regions, a second dummy region between each of the second and the fourth active regions and the sixth active region, and a third dummy region between the third and the seventh active regions.

18. The integrated circuit layout of claim 17, wherein a top edge of the first active region, a top edge of the first dummy region, and a top edge of the fifth active region are substantially aligned.

19. The integrated circuit layout of claim 17, further comprising a first well of the second conductivity type and a second well of the first conductivity type, wherein the first active region, the first dummy region, and the fifth active region are in the first well from a top view, the second and the fourth active regions and the sixth active region are in the second well from a top view, and a boundary line between the first well and the second well includes two bends that are disposed between the first column and the second column.

20. The integrated circuit layout of claim 17, wherein a width of the second dummy region is greater than a width of the sixth active region and is smaller than a distance from a top edge of the second active region to a bottom edge of the fourth active region.

* * * * *